United States Patent
Hwang et al.

(10) Patent No.: US 11,676,674 B2
(45) Date of Patent: Jun. 13, 2023

(54) APPARATUS AND METHOD FOR PROGRAMMING AND VERIFYING DATA IN A NON-VOLATILE MEMORY DEVICE

(71) Applicant: SK hynix Inc., Gyeonggi-do (KR)

(72) Inventors: Sung Hyun Hwang, Gyeonggi-do (KR); Jin Haeng Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/464,416

(22) Filed: Sep. 1, 2021

(65) Prior Publication Data
US 2022/0328113 A1 Oct. 13, 2022

(30) Foreign Application Priority Data
Apr. 7, 2021 (KR) .................. 10-2021-0045258

(51) Int. Cl.
| | |
|---|---|
| *G11C 16/04* | (2006.01) |
| *G11C 16/34* | (2006.01) |
| *G11C 16/10* | (2006.01) |
| *G11C 16/24* | (2006.01) |
| *G11C 16/08* | (2006.01) |
| *G11C 11/56* | (2006.01) |

(52) U.S. Cl.
CPC ...... *G11C 16/3459* (2013.01); *G11C 16/0483* (2013.01); *G11C 16/08* (2013.01); *G11C 16/10* (2013.01); *G11C 16/24* (2013.01); *G11C 11/5628* (2013.01)

(58) Field of Classification Search
CPC . G11C 16/3459; G11C 16/0483; G11C 16/08; G11C 16/10; G11C 16/24; G11C 11/5628
USPC ........................................ 365/185.11
See application file for complete search history.

(56) References Cited

U.S. PATENT DOCUMENTS 9,478,293 B2 * 10/2016 Yanagida ............ G11C 11/5628
9,536,601 B2 * 1/2017 Chen .................. G11C 16/10

FOREIGN PATENT DOCUMENTS

| KR | 101772578 B1 | 8/2017 |
| KR | 1020200098081 A | 8/2020 |

* cited by examiner

*Primary Examiner* — Tha-O H Bui
(74) *Attorney, Agent, or Firm* — IP & T Group LLP

(57) ABSTRACT

A memory device includes a cell group including a plurality of non-volatile memory cells capable of storing data and a control circuit configured to perform plural program loops for storing the data, each program loop including a program voltage application operation and a verification operation. During the respective program loop, the control circuit performs the verification operation for an N target level, an N−1 target level lower than the N target level, and an N+1 higher than the N target level, in response to the program voltage application operation for the N target level. When a quantity of non-volatile memory cells having threshold voltages over the N+1 target level satisfies a preset criterion, the control circuit skips a next verification for a target level lower than the N+1 target level, in response to a next program voltage application operation for the N+1 target level.

20 Claims, 12 Drawing Sheets

APPARATUS AND METHOD FOR PROGRAMMING AND VERIFYING DATA IN A NON-VOLATILE MEMORY DEVICE

CROSS-REFERENCE TO RELATED APPLICATIONS

This patent application claims the benefit of Korean Patent Application No. 10-2021-0045258, filed on Apr. 7, 2021, the entire disclosure of which is incorporated herein by reference.

TECHNICAL FIELD

One or more embodiments described herein relate to a memory system, and particularly, to an apparatus and method for improving data input/output operation speed in a non-volatile memory device in the memory system.

BACKGROUND

Recently, a paradigm for a computing environment has shifted to ubiquitous computing, which enables computer systems to be accessed virtually anytime and anywhere. As a result, the use of portable electronic devices (e.g., mobile phones, digital cameras, notebook computers, or the like) is rapidly increasing. Such portable electronic devices each may use or include a memory system having at least one memory device. The memory system may be a data storage device. The data storage device can be used as a main storage device or an auxiliary storage device of a portable electronic device.

Unlike a hard disk, such a data storage device uses non-volatile semiconductor memories, exhibits improved stability and durability, has no mechanical driving parts (e.g., a mechanical arm), and thus provides high data access speeds and relatively low power consumption. Examples of the data storage device having such advantages include, but are not limited to, Universal Serial Bus (USB) memory devices, memory cards having various interfaces, solid state drives (SSDs), and so on.

BRIEF DESCRIPTION OF THE DRAWINGS

The description herein makes reference to the accompanying drawings wherein like reference numerals refer to like parts throughout the figures.

DETAILED DESCRIPTION

Figure 1:
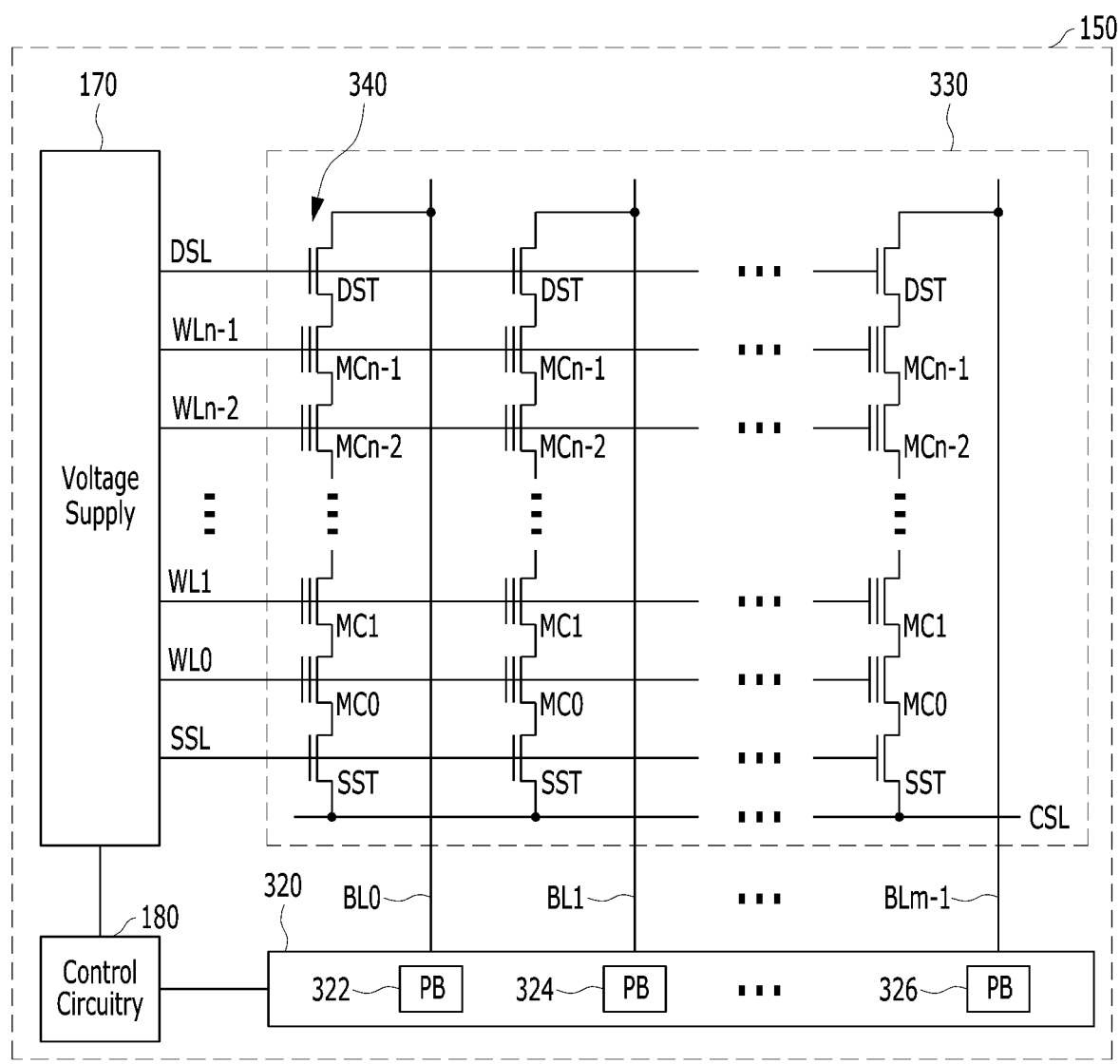
FIG. 1 illustrates a memory device according to an embodiment of the present disclosure.

Various embodiments of the present disclosure are described below with reference to the accompanying drawings. Elements and features of the disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language include hardware-for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in the disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or portion of a processor and its (or their) accompanying software and/or firmware. The term "circuitry" or "logic" also covers, for example, and if applicable to a particular claim element, an integrated circuit for a storage device.

As used herein, these terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

An embodiment of the present disclosure can provide a data processing system and a method for operating the data processing system. The data processing system includes components and resources such as a memory system and a host, and is capable of dynamically allocating plural data paths used for data communication between the components based on usages of the components and the resources.

An embodiment of the present disclosure can provide an apparatus and a method for improving data input/output speed of a memory device included in the data processing system.

According to an embodiment of the present disclosure, in a process of programming a data item in a non-volatile memory device, the data input/output speed can be improved by reducing the number of verification operations performed in the non-volatile memory device.

Furthermore, the memory device according to an embodiment of the present disclosure can reduce an operational burden for the verification operation, a wear degree of non-volatile memory cells in the memory device and interference between neighboring non-volatile memory cells of the memory device, so that safety of a stored data item can be improved.

In an embodiment, a memory device can include a cell group including a plurality of non-volatile memory cells capable of storing data; and a control circuit configured to perform plural program loops for storing the data, each program loop including a program voltage application operation for the plurality of non-volatile memory cells and a verification operation corresponding to the program voltage application operation. The control circuit can be configured to, during the respective program loop, perform the verification operation for an N target level, an N−1 target level lower than the N target level, and an N+1 higher than the N target level, in response to the program voltage application operation for the N target level. When a quantity of non-volatile memory cells having threshold voltages over the N+1 target level satisfies a preset criterion, the control circuit is configured to skip a next verification for a target level lower than the N+1 target level, in response to a next program voltage application operation for the N+1 target level.

A quantity of target levels corresponding to the plural program loops is three times greater than a quantity of bits of the data to be stored in each of the plurality of non-volatile memory cells.

The control circuit can be configured to perform the verification operation corresponding to the program voltage application operation by applying a first voltage to a selected word line for a first verification operation for the N+1 target level and apply a second voltage lower than the first voltage to the selected word line for second verification operations for the N−1 target level and the N target level.

The control circuit can be configured to precharge bit lines coupled to the plurality of non-volatile memory cells before the first verification operation and the second verification operations.

The control circuit can be configured to perform the verification operation corresponding to the program voltage application operation by applying a first voltage to the selected word line for a first verification operation for the N+1 target level and a second verification operation for the N−1 target level or the N target level. The control circuit is configured to perform the first verification operation longer than the second verification operation.

The control circuit can be configured to precharge bit lines coupled to the plurality of non-volatile memory cells before the first verification operation.

The control circuit changes or adjusts the preset criterion based on a program/erase cycle of the plurality of non-volatile memory cells.

In another embodiment, a memory system can include a controller configured to determine a location for storing program data and transfer a program command along with the program data; and a memory device coupled to the controller via a data path and configured to receive the program command and the program data and output a success or failure regarding a program operation for the program data. The memory device can include at least one memory block including a plurality of non-volatile memory cells capable of storing the program data; and a control circuit configured to perform plural program loops for storing the program data in at least some non-volatile memory cells coupled to a selected word line in the at least one memory block, each program loop including a program voltage application operation and a verification operation corresponding to the program voltage application operation. The control circuit can be configured to, during the respective program loop, perform the verification operation for an N target level, an N−1 target level lower than the N target level, and an N+1 higher than the N target level, in response to the program voltage application operation for the N target level. When a quantity of non-volatile memory cells among the at least some non-volatile memory cells having threshold voltages over the N+1 target level satisfies a preset criterion, the control circuit is configured to skip a next verification for a target level lower than the N+1 target level, in response to a next program operation for the N+1 target level.

The memory device can include a buffer configured to temporarily store the program data to be stored in the location; and a voltage supply circuit controlled by the control circuit to supply a first voltage to the selected word line and apply a second voltage having a different level from the first voltage to an unselected word line.

A quantity of target levels corresponding to the plural program loops is three times greater than a quantity of bits of the program data to be stored in each of the plurality of non-volatile memory cells.

The control circuit can be configured to perform the verification operation corresponding to the program voltage application operation by applying a first voltage to the selected word line for a first verification operation for the N+1 target level and apply a second voltage lower than the first voltage to the selected word line for second verification operations for the N−1 target level and the N target level.

The control circuit can be configured to precharge bit lines coupled to the at least some non-volatile memory cells before the first verification operation and the second verification operations.

The control circuit can be configured to perform the verification operation corresponding to the program voltage application operation by applying a first voltage to the selected word line for a first verification operation for the N+1 target level and a second verification operation for the N−1 target level or the N target level. The control circuit is configured to perform the first verification operation longer than the second verification operation.

The control circuit can be configured to precharge bit lines coupled to the at least some non-volatile memory cells before the first verification operation.

The control circuit changes or adjusts the preset criterion based on a program/erase cycle of the plurality of non-volatile memory cells.

In another embodiment, a method for operating a memory device can include receiving program data, information regarding a location for storing the program data, and a program command; selecting a word line corresponding to the information regarding the location; and performing plural program loops for storing the program data in at least some non-volatile memory cells coupled to a selected word line, each program loop including a program voltage application operation for the plurality of non-volatile memory cells and a verification operation corresponding to the program voltage application operation. The performing the plural program loops can include, during the respective program loop, performing the verification operation for an N target level, an N−1 target level lower than the N target level, and an N+1 higher than the N target level, in response to the program operation for the N target level; determining whether a quantity of non-volatile memory cells among the at least some non-volatile memory cells having threshold voltages over the N+1 target level satisfies a preset criterion; and skipping a next verification for a target level lower than the N+1 target level, in response to a next program operation for the N+1 target level, based on a result of the determining.

The performing the verification operation can include applying a first voltage to the selected word line for a first verification operation for the N+1 target level; and supplying a second voltage lower than the first voltage to the selected word line for second verification operations for the N−1 target level and the N target level.

The performing the verification operation can further include precharging bit lines coupled to the at least some non-volatile memory cells before the first verification operation; and precharging the bit lines coupled to the at least some non-volatile memory cells before the second verification operations.

The performing the verification operation can include applying a first voltage to a word line coupled to the at least some non-volatile memory cells for a first verification operation for the N+1 target level and a second verification for the N−1 target level or the N target level. The first verification operation can be carried out longer than the second verification operations.

The performing the verification operation can further include precharging bit lines coupled to the at least some non-volatile memory cells before the first verification operation.

In another embodiment, an operating method of a memory device can include performing a plurality of program loops each including first and second operations according to an incremental step pulse programming (ISPP) scheme, wherein the first operation within a current program loop includes an operation of applying a program voltage to a selected word line in order for at least one memory cell coupled to the selected word line to have a programmed state of a current target level, and wherein the second operation within the current program loop includes an operation of verifying whether memory cells coupled to the selected word line have programmed states of the current target level and a higher target level when at least one memory cell coupled to the selected word lines is verified to have the program state of the current target level in a previous program loop.

Embodiments of the present disclosure will now be described with reference to the accompanying drawings, wherein like numbers reference like elements.

FIG. 1 illustrates a memory system 110 according to an embodiment of the present disclosure. Specifically, FIG. 1 schematically illustrates a memory cell array circuit in a memory die included in a memory device according to an embodiment of the present disclosure.

Referring to FIG. 1, a memory die 200 can include a memory group 330 including a plurality of non-volatile memory cells. The memory group 330 can include a plurality of cell strings 340. The cell string 340 includes plural non-volatile memory cells connected to each of plural bit lines BL0 to BLm−1. The cell string 340 disposed in each column of the memory group 330 can include at least one drain select transistor DST and at least one source select transistor SST. A plurality of non-volatile memory cells or memory cell transistors MC0 to MCn−1 may be connected in series between the drain and source select transistors DST, SST. For example, each of the non-volatile memory cells MC0 to MCn−1 may be configured as a multi-level cell (MLC) that stores a data item having plural bits per cell. The cell strings 340 may be electrically connected to the corresponding bit lines BL0 to BLm−1, individually.

FIG. 1 shows the memory group 330 including NAND-type flash memory cells as an example. However, the memory group 330 included in a memory device 150 according to an embodiment of the present disclosure may not be limited to the NAND-type flash memory. In another embodiment, the memory group 330 can also be implemented as a NOR-type flash memory, a hybrid flash memory in which at least two different types of memory cells are mixed or combined, or a one-chip NAND flash memory in which a controller is embedded in a single memory chip. In addition, the memory group 330 according to an embodiment of the present disclosure can include a flash memory cell in which a charge trap flash (CTF) layer including a conductive floating gate or insulating layer is included.

Figure 2:
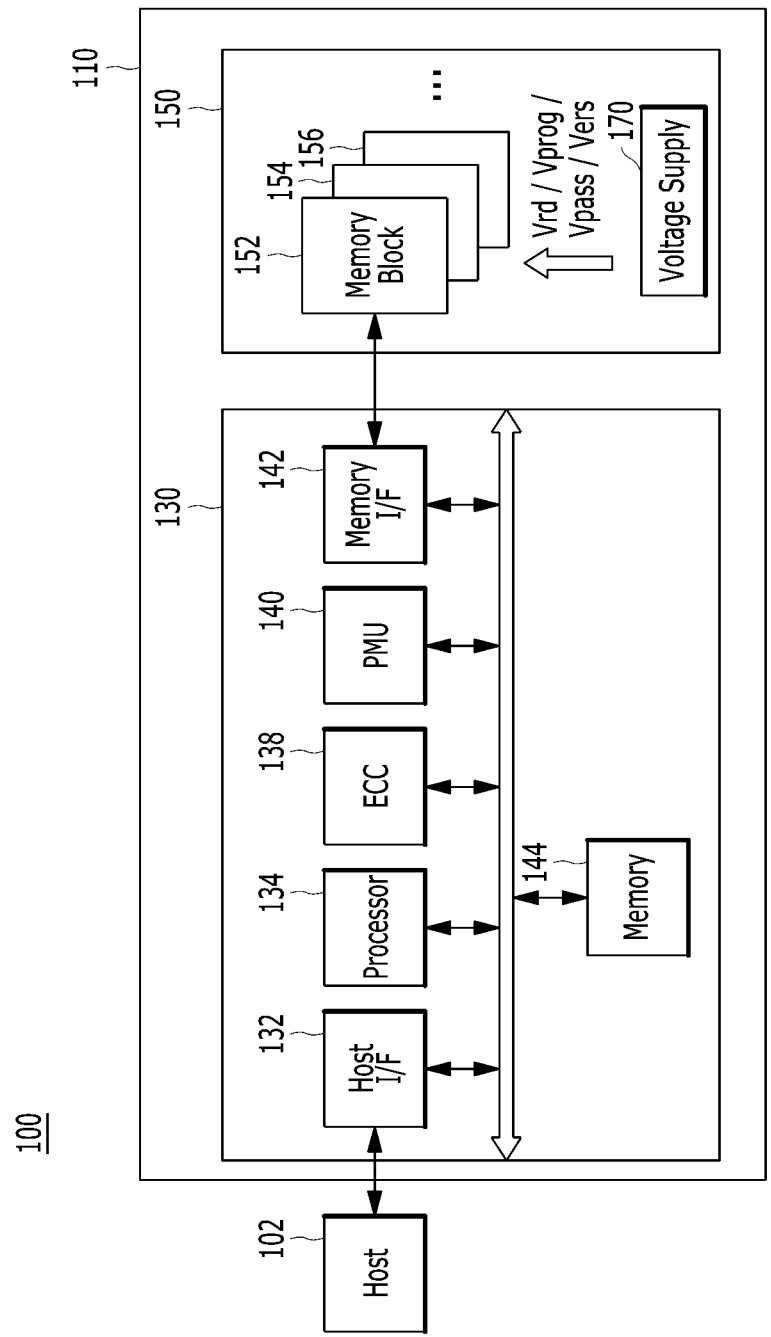
FIG. 2 illustrates a data processing system according to an embodiment of the present disclosure.

According to an embodiment of the present disclosure, the memory group 330 shown in FIG. 1 may include at least one memory block 152, 154, 156 included in the memory device 150 shown in FIG. 2. According to an embodiment, the memory device 150 can have a two-dimensional (2D) or three-dimensional (3D) structure. For example, each of the memory blocks 152, 154, 156 in the memory device 150 may be implemented as a 3D structure (or a vertical structure). Each of the memory blocks 152, 154, 156 may have a three-dimensional structure extending along first to third directions, for example, an x-axis direction, a y-axis direction, and a z-axis direction.

The memory group 330 constituting the plurality of memory blocks 152, 154, 156 of the memory device 150 can be coupled to a plurality of bit lines BL, a plurality of string select lines SSL, and a plurality of drain select lines DSL, a plurality of word lines WL, a plurality of dummy word lines DWL, and a plurality of common source lines CSL. The memory group 300 can include a plurality of NAND strings NS, each NAND string NS including a plurality of memory cells MC. In the memory group 330, each NAND string NS may be connected to each bit line BL. In addition, the string select transistor SST of each NAND string NS may be connected to a common source line CSL, and the drain select transistor DST of each NAND string NS can be connected to a corresponding bit line BL. Here, the memory cells MC may be arranged between the string select transistor SST and the drain select transistor DST of each NAND string NS.

Referring to FIG. 1, a voltage supply circuit 170 in the memory device 150 can supply a word line voltage (e.g., a subject voltage such as a program voltage, a read voltage, and a pass voltage) via each word line according to an operation mode, or supply a voltage to a bulk (e.g., a well region) in which each memory block including the memory cells MC are formed. In this case, a voltage generating operation of the voltage supply circuit 170 may be performed under a control of a control circuit (not shown). Also, the voltage supply circuit 170 may generate a plurality of variable read voltages to distinguish a plurality of data items from each other. In response to the control of the control circuit, one of the memory blocks (or sectors) of the memory cell array may be selected, and one of the word lines of the selected memory block may be selected. Word line voltages may be supplied to the selected word line and the unselected word line, individually. The voltage supply circuit 170 may include a voltage generation circuit (refer to FIGS. 4 to 8) for generating target voltages having various levels. The voltage supply circuit 170 may be coupled to a first pin or pad receiving a first power voltage VCC applied from the outside (e.g., an external device) and a second pin or pad receiving the second power voltage VPP applied from the external device. Here, the second power voltage VPP may have a voltage level twice or more higher than that of the first power voltage VCC. For example, the first power voltage VCC may have a voltage level of 2.0V to 5.5V, while the second power supply voltage may have a voltage level of 9V to 13V. The voltage supply circuit 170 according to an embodiment of the present disclosure can include a voltage generation circuit for more rapidly generating the target voltages of various levels used in the memory group 330. The voltage generation circuit can use the second power supply voltage VPP to generate a target voltage which has a higher voltage level than the second power voltage VPP.

A read/write circuit 320 controlled by the control circuit of the memory device 150 may operate as a sense amplifier or a write driver according to an operation mode. For example, in a verify operation and a read operation, the read/write circuit 320 may operate as a sense amplifier for reading the data item from the memory cell array. Also, in a program operation, the read/write circuit 320 may operate as a write driver that controls potentials of bit lines according to a data item to be stored in the memory cell array. The read/write circuit 320 may receive the data item to be programmed to the cell array from page buffers (not shown) during the program operation. The read/write circuit 320 can drive bit lines based on the input data item. To this end, the read/write circuit 320 includes a plurality of page buffers (PB) 322, 324, 326, each page buffer corresponding to each column (or each bit line) or each column pair (or each bit line pair). According to an embodiment, a plurality of latches (not shown) may be included in each of the page buffers 322, 324, 326.

Although not shown, the page buffers 322, 324, 326 may be coupled to a data input/output device (e.g., a serialization circuit or a serializer) through a plurality of buses BUS. When each of the page buffers 322, 324, 326 is coupled to the data input/output device through different buses, a delay that may occur in data transmission from the page buffers 322, 324, 326 can be reduced. For example, each page buffer 322, 324, 326 can perform the data transmission without no waiting time.

FIG. 2 illustrates a data processing system 100 according to an embodiment of the present disclosure.

Referring to FIG. 2, the data processing system 100 may include a host 102 engaged or coupled with a memory system, such as memory system 110. For example, the host 102 and the memory system 110 can be coupled to each other via a data bus, a host cable and the like to perform data communication.

The memory system 110 may include a memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements functionally divided. Further, according to an embodiment, the memory device 150 and the controller 130 may be implemented with a single chip or a plurality of chips. The controller 130 may perform a data input/output operation in response to a request input from the external device. For example, when the controller 130 performs a read operation in response to a read request input from an external device, data stored in a plurality of non-volatile memory cells included in the memory device 150 is transferred to the controller 130.

As shown in FIG. 2, the memory device 150 may include a plurality of memory blocks 152, 154, 156. The memory block 152, 154, 156 may be understood as a group of non-volatile memory cells in which data is removed together by a single erase operation. Although not illustrated, the memory block 152, 154, 156 may include a page which is a group of non-volatile memory cells that store data together during a single program operation or output data together during a single read operation. For example, one memory block may include a plurality of pages.

For example, the memory device 150 may include a plurality of memory planes or a plurality of memory dies. According to an embodiment, the memory plane may be considered a logical or a physical partition including at least one memory block, a driving circuit capable of controlling an array including a plurality of non-volatile memory cells, and a buffer that can temporarily store data inputted to, or outputted from, non-volatile memory cells.

In addition, according to an embodiment, the memory die may include at least one memory plane. The memory die may be understood as a set of components implemented on a physically distinguishable substrate. Each memory die may be connected to the controller 130 through a data path. Each memory die may include an interface to exchange an item of data and a signal with the controller 130.

According to an embodiment, the memory device 150 may include at least one memory block 152, 154, 156, at least one memory plane, or at least one memory die. The internal configuration of the memory device 150 shown in FIG. 1 may be different according to performance of the memory system 110. An embodiment of the present disclosure is not limited to the internal configuration shown in FIG. 2.

Referring to FIG. 2, the memory device 150 may include the voltage supply circuit 170 capable of supplying at least some voltage into the memory block 152, 154, 156. The voltage supply circuit 170 can include a voltage generation circuit used for generating target voltages used in the memory block 152, 154, 156, referring to FIGS. 4 to 8. The voltage supply circuit 170 may supply a read voltage Vrd, a program voltage Vprog, a pass voltage Vpass, or an erase voltage Vers into a non-volatile memory cell included in the memory block. For example, during a read operation for reading data stored in the non-volatile memory cell included in the memory block 152, 154, 156, the voltage supply circuit 170 may supply the read voltage Vrd into a selected non-volatile memory cell. During the program operation for storing data in the non-volatile memory cell included in the memory block 152, 154, 156, the voltage supply circuit 170 may supply the program voltage Vprog into a selected non-volatile memory cell. Also, during a read operation or a program operation performed on the selected non-volatile memory cell, the voltage supply circuit 170 may supply a pass voltage Vpass into a non-selected non-volatile memory cell. During the erasing operation for erasing data stored in the non-volatile memory cell included in the memory block 152, 154, 156, the voltage supply circuit 170 may supply the erase voltage Vers into the memory block.

The memory device 150 may store information regarding various voltages which are supplied to the memory block 152, 154, 156 based on which operation is performed. For example, when a non-volatile memory cell in the memory block 152, 154, 156 can store multi-bit data, plural levels of the read voltage Vrd for recognizing or reading the multi-bit data item may be required. The memory device 150 may include a table including information corresponding to plural levels of the read voltage Vrd, corresponding to the multi-bit data item. For example, the table can include bias values stored in a register, each bias value corresponding to a specific level of the read voltage Vrd. The number of bias values for the read voltage Vrd that is used for a read operation may be limited to a preset range. Also, the bias values can be quantized.

The host 102 may include a portable electronic device (e.g., a mobile phone, an MP3 player, a laptop computer, etc.) or a non-portable electronic device (e.g., a desktop computer, a game player, a television, a projector, etc.). According to an embodiment, the host 102 can include a central processing unit (CPU) included in the portable electronic device and the non-portable electronic device.

The host 102 may also include at least one operating system (OS), which can control functions and operations performed in the host 102. The OS can provide interoperability between the host 102 engaged operatively with the memory system 110 and a user who intends to store data in the memory system 110. The OS may support functions and operations corresponding to a user's requests. By the way of example but not limitation, the OS can be classified into a general operating system and a mobile operating system according to mobility of the host 102. The general operating system may be split into a personal operating system and an enterprise operating system according to system requirements or a user environment. As compared with the personal operating system, the enterprise operating systems can be specialized for securing and supporting high performance computing.

The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to the plurality of commands within the memory system 110.

A controller 130 in the memory system 110 may control a memory device 150 in response to a request or a command input from the host 102. For example, the controller 130 may perform a read operation to provide data read from the memory device 150 to the host 102 and may perform a write operation (or a program operation) to store data input from the host 102 in the memory device 150. In order to perform data input/output (I/O) operations, the controller 130 may control and manage internal operations of reading data, programming data, erasing data, or the like.

According to an embodiment, the controller 130 may include a host interface 132, a processor 134, error correction circuitry (ECC) 138, a power management unit (PMU) 140, a memory interface 142, and a memory 144. Components included in the controller 130 as illustrated in FIG. 2 may vary according to structures, functions, operation performance, or the like, regarding the memory system 110.

For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components may be added to or omitted from the controller 130 according to implementation of the memory system 110.

The host 102 and the memory system 110 each may include a controller or an interface for transmitting and receiving signals, data, and the like, in accordance with one or more predetermined protocols. For example, the host interface 132 in the memory system 110 may include an apparatus capable of transmitting signals, data, and the like to the host 102 or receiving signals, data, and the like from the host 102.

The host interface 132 included in the controller 130 may receive signals, commands (or requests), and/or data input from the host 102. For example, the host 102 and the memory system 110 may use a predetermined protocol to transmit and receive data therebetween. Examples of communication standards, protocols or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like. According to an embodiment, the host interface 132 is a type of layer for exchanging data with the host 102 and is implemented with, or driven by, firmware called a host interface layer (HIL).

The Integrated Drive Electronics (IDE) or Advanced Technology Attachment (ATA) may be used as one of the interfaces for transmitting and receiving data and, for example, may use a cable including 40 wires connected in parallel to support data transmission and data reception between the host 102 and the memory system 110. When a plurality of memory systems 110 are connected to a single host 102, the plurality of memory systems 110 may be divided into a master and a slave by using a position or a dip switch to which the plurality of memory systems 110 are connected. The memory system 110 set as the master may be used as a main memory device. The IDE (ATA) may include, for example, Fast-ATA, ATAPI, or Enhanced IDE (EIDE).

A Serial Advanced Technology Attachment (SATA) interface is a type of serial data communication interface that is compatible with various ATA standards of parallel data communication interfaces which are used by Integrated Drive Electronics (IDE) devices. The 40 wires in the IDE interface can be reduced to six wires in the SATA interface. For example, 40 parallel signals for the IDE can be converted into 6 serial signals for the SATA interface. The SATA interface has been widely used because of its faster data transmission and reception rate and its less resource consumption in the host 102 used for the data transmission and reception. The SATA interface may connect up to 30 external devices to a single transceiver included in the host 102. In addition, the SATA interface can support hot plugging that allows an external device to be attached to or detached from the host 102, even while data communication between the host 102 and another device is being executed. Thus, the memory system 110 can be connected or disconnected as an additional device, like a device supported by a universal serial bus (USB) even when the host 102 is powered on. For example, in the host 102 having an eSATA port, the memory system 110 may be freely attached to or detached from the host 102 like an external hard disk.

Small Computer System Interface (SCSI) is a type of serial data communication interface used for connecting a computer or a server with other peripheral devices. The SCSI can provide a high transmission speed, as compared with other interfaces such as IDE and SATA. In the SCSI, the host 102 and at least one peripheral device (e.g., memory system 110) are connected in series, but data transmission and reception between the host 102 and each peripheral device may be performed through a parallel data communication. In the SCSI, it is easy to connect or disconnect a device such as the memory system 110 to or from the host 102. The SCSI can support connections of 15 other devices to a single transceiver included in host 102.

Serial Attached SCSI (SAS) can be understood as a serial data communication version of the SCSI. In the SAS, the host 102 and a plurality of peripheral devices are connected in series, and data transmission and reception between the host 102 and each peripheral device may be performed in a serial data communication scheme. The SAS can support connection between the host 102 and the peripheral device through a serial cable instead of a parallel cable, to easily manage equipment using the SAS and enhance or improve operational reliability and communication performance. The SAS may support connections of eight external devices to a single transceiver included in the host 102.

The Non-volatile memory express (NVMe) is a type of interface based at least on a Peripheral Component Interconnect Express (PCIe) designed to increase performance and design flexibility of the host 102, servers, computing devices, and the like equipped with the non-volatile memory system 110. The PCIe can use a slot or a specific cable for connecting a computing device (e.g., host 102) and a peripheral device (e.g., memory system 110). For example, the PCIe can use a plurality of pins (e.g., 18 pins, 32 pins, 49 pins, or 82 pins) and at least one wire (e.g., x1, x4, x8, or x16) to achieve high speed data communication over several hundred MB per second (e.g., 250 MB/s, 500 MB/s, 984.6250 MB/s, or 1969 MB/s). According to an embodiment, the PCIe scheme may achieve bandwidths of tens to hundreds of Giga bits per second. The NVMe can support an operation speed of the non-volatile memory system 110, such as an SSD, that is faster than a hard disk.

According to an embodiment, the host 102 and the memory system 110 may be connected through a universal serial bus (USB). The Universal Serial Bus (USB) is a type of scalable, hot-pluggable plug-and-play serial interface that can provide cost-effective standard connectivity between the host 102 and peripheral devices such as a keyboard, a mouse, a joystick, a printer, a scanner, a storage device, a modem, a video camera, and the like. A plurality of peripheral devices such as the memory system 110 may be coupled to a single transceiver included in the host 102.

Referring to FIG. 2, the error correction circuitry 138 can correct error bits of data read from the memory device 150, and may include an error correction code (ECC) encoder and an ECC decoder. The ECC encoder may perform error correction encoding of data to be programmed in the memory device 150 to generate encoded data into which a parity bit is added, and store the encoded data in memory device 150. The ECC decoder can detect and correct error bits contained in the data read from the memory device 150 when the controller 130 reads the data stored in the memory device 150. For example, after performing error correction decoding on the data read from the memory device 150, the error correction circuitry 138 determines whether the error correction decoding has succeeded or not, and outputs an instruction signal (e.g., a correction success signal or a correction fail signal), based on a result of the error correction decoding. The error correction circuitry 138 may use a parity bit, which has been generated during the ECC encoding process for the data stored in the memory device 150, in order to correct the error bits of the read data. When the number of the error bits is greater than or equal to the number of correctable error bits, the error correction circuitry 138 may not correct the error bits and instead may output the correction fail signal indicating failure in correcting the error bits.

According to an embodiment, the error correction circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above described codes. The error correction circuitry 138 shown in FIG. 2 can include at least some of components included in the controller 130 shown in FIG. 1.

For example, the ECC decoder may perform hard decision decoding or soft decision decoding on data transmitted from the memory device 150. The hard decision decoding can be understood as one of two methods broadly classified for error correction. The hard decision decoding may include an operation of correcting an error bit by reading digital data of '0' or '1' from a non-volatile memory cell in the memory device 150. Because the hard decision decoding handles a binary logic signal, the circuit/algorithm design or configuration may be simpler and a processing speed may be faster than the soft decision decoding.

The soft decision decoding may quantize a threshold voltage of a non-volatile memory cell in the memory device 150 by two or more quantized values (e.g., multiple bit data, approximate values, an analog value, and the like) in order to correct an error bit based on the two or more quantized values. The controller 130 can receive two or more alphabets or quantized values from a plurality of non-volatile memory cells in the memory device 150, and then perform a decoding based on information generated by characterizing the quantized values as a combination of information such as conditional probability or likelihood.

According to an embodiment, the ECC decoder may use low-density parity-check and generator matrix (LDPC-GM) code among methods designed for the soft decision decoding. The low-density parity-check (LDPC) code uses an algorithm that can read values of data from the memory device 150 in several bits according to reliability, not simply data of 1 or 0 like the hard decision decoding, and iteratively repeats it through a message exchange in order to improve reliability of the values. Then, the values are finally determined as data of 1 or 0. For example, a decoding algorithm using LDPC codes can be understood as probabilistic decoding. The hard decision decoding in which a value output from a non-volatile memory cell is coded as 0 or 1. Compared to the hard decision decoding, the soft decision decoding can determine the value stored in the non-volatile memory cell based on the stochastic information. Regarding bit-flipping (which may be considered an error that can occur in the memory device 150), the soft decision decoding may provide improved probability of correcting the error and recovering data, as well as providing reliability and stability of corrected data. The LDPC-GM code may have a scheme in which internal LDGM codes can be concatenated in series with high-speed LDPC codes.

According to an embodiment, the ECC decoder may use, for example, low-density parity-check convolutional codes (LDPC-CCs) for the soft decision decoding. The LDPC-CCs may have a scheme using a linear time encoding and a pipeline decoding based on a variable block length and a shift register.

According to an embodiment, the ECC decoder may use, for example, a Log Likelihood Ratio Turbo Code (LLR-TC) for the soft decision decoding. A Log Likelihood Ratio (LLR) may be calculated as a non-linear function for a distance between a sampled value and an ideal value. In addition, a Turbo Code (TC) may include a simple code (for example, a Hamming code) in two or three dimensions and repeat decoding in a row direction and a column direction to improve reliability of values.

The power management unit (PMU) 140 may control electrical power provided to the controller 130. The PMU 140 may monitor the electrical power supplied to the memory system 110 (e.g., a voltage supplied to the controller 130) and provide the electrical power to components included in the controller 130. The PMU 140 may not only detect power-on or power-off, but also generate a trigger signal to enable the memory system 110 to urgently back up a current state when the electrical power supplied to the memory system 110 is unstable. According to an embodiment, the PMU 140 may include a device or a component capable of accumulating electrical power that may be used in an emergency.

The memory interface 142 may serve as an interface for handling commands and data transferred between the controller 130 and the memory device 150, in order to allow the controller 130 to control the memory device 150 in response to a command or a request input from the host 102. In a case when the memory device 150 is a flash memory, the memory interface 142 may generate a control signal for the memory device 150 and may process data input to, or output from, the memory device 150 under the control of the processor 134.

For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) for exchanging data with the memory device 150.

According to an embodiment, the memory interface 142 may support an open NAND flash interface (ONFi), a toggle mode, or the like, for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or the like.

The memory 144 may be used as a working memory of the memory system 110 or the controller 130, while temporarily storing transactional data of operations performed in the memory system 110 and the controller 130. For example, the memory 144 may temporarily store read data output from the memory device 150 in response to a read request from the host 102 before the read data is output to the host 102. In addition, the controller 130 may temporarily store write data input from the host 102 in the memory 144 before programming the write data in the memory device 150. When the controller 130 controls operations, such as a data read operation, a data write or program operation, a data erase operation, etc., of the memory device 150, data transmitted between the controller 130 and the memory device 150 of the memory system 110 may be temporarily stored in the memory 144.

In addition to the read data or write data, the memory 144 may store information (e.g., map data, read requests, program requests, etc.) used for inputting or outputting data between the host 102 and the memory device 150. According to an embodiment, the memory 144 may include one or more of a command queue, a program memory, a data memory, a write buffer/cache, a read buffer/cache, a data buffer/cache, a map buffer/cache, and so on. The controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 2 illustrates, for example, the memory 144 disposed within the controller 130, embodiments are not limited thereto. The memory 144 may be located within or external to the controller 130. For instance, the memory 144 may be embodied by an external volatile memory having a memory interface transferring data and/or signals between the memory 144 and the controller 130.

The processor 134 may control the overall operations of the memory system 110. For example, the processor 134 can control a program operation or a read operation of the memory device 150 in response to a write request or a read request entered from the host 102. According to an embodiment, the processor 134 may execute firmware to control the program operation or the read operation in the memory system 110. Herein, the firmware may be referred to as a flash translation layer (FTL). According to an embodiment, the processor 134 may be implemented with a microprocessor, a central processing unit (CPU), or the like.

According to an embodiment, the memory system 110 may be implemented with at least one multi-core processor. The multi-core processor is a type of circuit or chip in which two or more cores, which are considered distinct processing regions, are integrated. For example, when a plurality of cores in the multi-core processor drive or execute a plurality of flash translation layers (FTLs) independently, a data input/output speed (or performance) of the memory system 110 may be improved. According to an embodiment, the data input/output (I/O) operations in the memory system 110 may be independently performed through different cores in the multi-core processor.

The processor 134 in the controller 130 may perform an operation corresponding to a request or a command input from the host 102. Further, the memory system 110 may perform an operation independent from a command or a request input from the host 102. In one case, an operation performed by the controller 130 in response to the request or the command input from the host 102 may be considered a foreground operation, while an operation performed by the controller 130 independently from the request or the command input from the host 102 may be considered a background operation. The controller 130 can perform foreground or background operations for reading, writing, or erasing data in the memory device 150. In addition, a parameter set operation corresponding to a set parameter command or a set feature command as a set command transmitted from the host 102 may be considered a foreground operation. Examples of background operations that may be performed without a command transmitted from the host 102, the controller 130 can perform garbage collection (GC), wear leveling (WL), bad block management for identifying and processing bad blocks, or the like.

According to an embodiment, substantially similar operations may be performed as both the foreground operation and the background operation. For example, when the memory system 110 performs garbage collection in response to a request or a command input from the host 102 (e.g., Manual GC), the garbage collection can be considered a foreground operation. When the memory system 110 performs garbage collection independently of the host 102 (e.g., Auto GC), the garbage collection can be considered a background operation.

When the memory device 150 includes a plurality of dies (or a plurality of chips) each including a plurality of non-volatile memory cells, the controller 130 may perform parallel processing regarding plural requests or commands input from the host 102 in order to improve performance of the memory system 110. For example, the transmitted requests or commands may be divided into plural groups including at least some of a plurality of planes, a plurality of dies, or a plurality of chips included in the memory device 150, and the plural groups of requests or commands are processed individually or in parallel in each plane, each die or each chip.

The memory interface 142 in the controller 130 may be connected to the plurality of dies or chips in the memory device 150 through at least one channel and at least one way. When the controller 130 distributes and stores data in the plurality of dies through each channel or each way in response to requests or commands associated with a plurality of pages including non-volatile memory cells, a plurality of operations corresponding to the requests or the commands can be performed simultaneously or in parallel in the plurality of dies or planes. Such a processing method or scheme can be considered as an interleaving method. Because a data input/output speed of the memory system 110 increases by operating with the interleaving method, data I/O performance of the memory system 110 can be improved.

By way of example but not limitation, the controller 130 can recognize statuses of a plurality of channels (or ways) associated with the plurality of dies included in the memory device 150. The controller 130 may determine a status of each channel or each way as one of a busy status, a ready status, an active status, an idle status, a normal status, and an abnormal status. The determination of which channel or way an instruction (and/or a data) is delivered through by the controller can be associated with a physical block address. The controller 130 may refer to descriptors delivered from the memory device 150. The descriptors may include a block or page of parameters describing something about the memory device 150. The descriptors can have a predetermined format or structure. For instance, the descriptors may include device descriptors, configuration descriptors, unit descriptors, and the like. The controller 130 may refer to, or use, the descriptors to determine which channel(s) or way(s) is used to exchange an instruction or data.

Referring to FIG. 2, the memory device 150 in the memory system 110 may include a plurality of memory blocks 152, 154, 156. Each of the plurality of memory blocks 152, 154, 156 includes a plurality of non-volatile memory cells. According to an embodiment, the memory block 152, 154, 156 can be a group of non-volatile memory cells erased together. The memory block 152, 154, 156 may include a plurality of pages which is a group of non-volatile memory cells read or programmed together.

In one embodiment, each memory block 152, 154, or 156 may have a three-dimensional stack structure for high integration. Further, the memory device 150 may include a plurality of dies, each die including a plurality of planes, each plane including the plurality of memory blocks 152, 154, 156. A configuration of the memory device 150 may be changed depending on performance of the memory system 110.

FIG. 2 illustrates the memory device 150 that includes the plurality of memory blocks 152, 154, and 156. The plurality of memory blocks 152, 154, and 156 may be any of single-level cell (SLC) memory blocks, multi-level cell (MLC) memory blocks, or the like, according to the number of bits that can be stored in one memory cell. An SLC memory block includes a plurality of pages implemented by memory cells, each memory cell storing one bit of data. An SLC memory block may have higher data I/O operation performance and higher durability than the MLC memory block. The MLC memory block includes a plurality of pages implemented by memory cells, each memory cell storing multi-bit data (e.g., two or more bits of data). The MLC memory block may have larger storage capacity for the same space compared to the SLC memory block. The MLC memory block can be highly integrated in view of storage capacity.

In an embodiment, the memory device 150 may be implemented with MLC memory blocks such as a double level cell (DLC) memory block, a triple-level cell (TLC) memory block, a quadruple-level cell (QLC) memory block, and a combination thereof. The DLC memory block may include a plurality of pages implemented by memory cells, each memory cell capable of storing 2-bit data. The TLC memory block can include a plurality of pages implemented by memory cells, each memory cell capable of storing 3-bit data. The QLC memory block can include a plurality of pages implemented by memory cells, each memory cell capable of storing 4-bit data. In another embodiment, the memory device 150 can be implemented with a block including a plurality of pages implemented by memory cells, each memory cell capable of storing five or more bits of data.

According to an embodiment, the controller 130 may use a MLC memory block included in the memory device 150 as an SLC memory block that stores one-bit data in one memory cell. A data input/output speed of the multi-level cell (MLC) memory block can be slower than that of the SLC memory block. That is, when the MLC memory block is used as the SLC memory block, a margin for a read or program operation can be reduced. For example, the controller 130 may perform a data input/output operation with a higher speed when the MLC memory block is used as the SLC memory block. Thus, the controller 130 may use the MLC memory block as a SLC buffer to temporarily store data because the buffer may require a high data input/output speed for improving performance of the memory system 110.

Further, according to an embodiment, the controller 130 can program data in a MLC a plurality of times without performing an erase operation on a specific MLC memory block included in the memory device 150. In general, non-volatile memory cells do not support data overwrite. However, the controller 130 may program 1-bit data in the MLC a plurality of times using a feature in which the MLC is capable of storing multi-bit data. For a MLC overwrite operation, the controller 130 may store the number of program times as separate operation information when 1-bit data is programmed in a MLC. According to an embodiment, an operation for uniformly levelling threshold voltages of the MLCs may be carried out before another 1-bit data is programmed in the same MLCs, each having stored another-bit data.

In an embodiment, the memory device 150 is embodied as a non-volatile memory such as a flash memory, for example, as a NAND flash memory, a NOR flash memory, or the like. In another embodiment, the memory device 150 may be implemented by at least one of a phase change random access memory (PCRAM), a ferroelectrics random access memory (FRAM), a transfer torque random access memory (STT-RAM), and a spin transfer torque magnetic random access memory (STT-MRAM), or the like.

Figure 3:
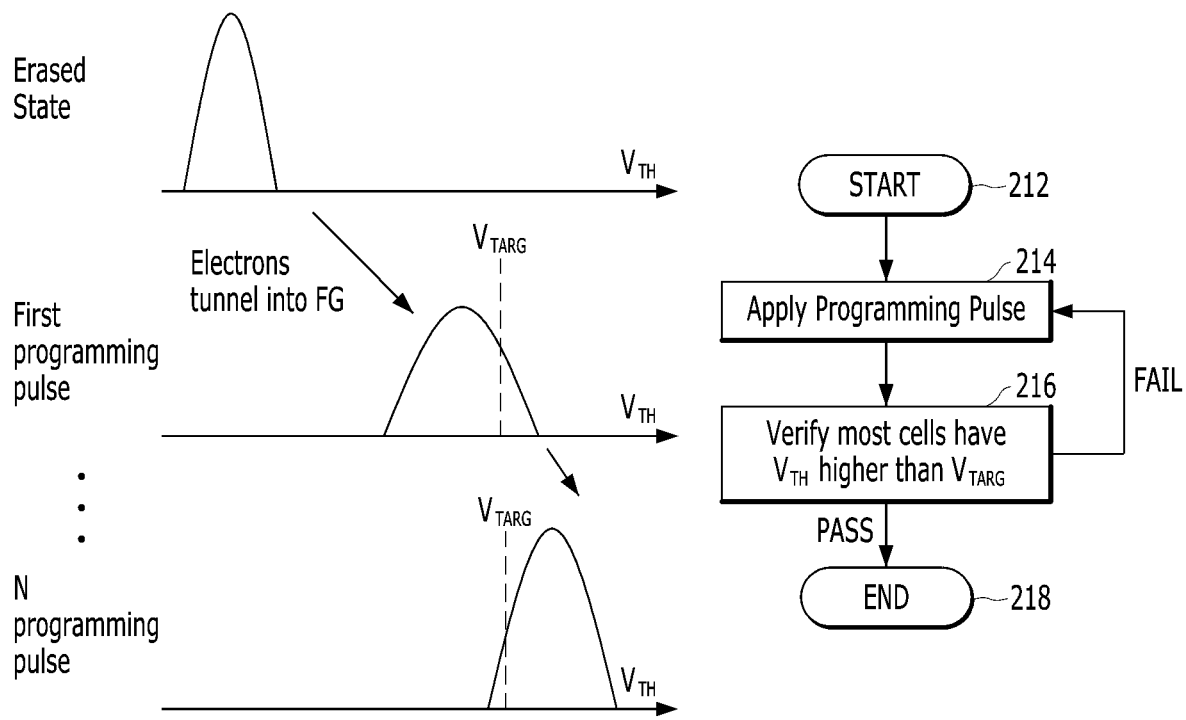
FIG. 3 illustrates an Incremental Step Pulse Programming (ISPP) operation according to an embodiment of the present disclosure.

FIG. 3 illustrates an Incremental Step Pulse Programming (ISPP) operation.

Referring to FIG. 3, data may be programmed in a non-volatile memory cell being in an erased state. When a programming pulse is supplied to a word line coupled to the non-volatile memory cell, the threshold voltage distribution of the non-volatile memory cell may shift from the erased state to the right (a direction in which the threshold voltage increases). If the programming pulse is continuously supplied to the non-volatile memory cell, the threshold voltage distribution of the non-volatile memory cell may continuously shift to the right. The programming pulse may be supplied until most of the plurality of non-volatile memory cells have a threshold voltage higher than the target voltage VTARG in a threshold voltage distribution.

More specifically, when a program operation starts (operation 212), the memory device 150 can apply a programming pulse to a plurality of non-volatile memory cells to be programmed with data (operation 214). After a programming pulse is applied, the memory device 150 can verify whether most of the plurality of non-volatile memory cells have a threshold voltage VTH higher than the target voltage VTARG (operation 216). When it is determined that most of the plurality of non-volatile memory cells do not have a threshold voltage VTH higher than the target voltage VTARG according to a verification result FAIL, the memory device 150 applies another programming pulse to the corresponding non-volatile memory cells (operation 214). When most of the plurality of non-volatile memory cells have a threshold voltage VTH higher than the target voltage VTARG according to another verification result PASS, the memory device 150 may end the program operation (operation 218).

In order to narrow the threshold voltage distribution of the plurality of non-volatile memory cells, it is advantageous to slightly shift the threshold voltage distribution of the plurality of non-volatile memory cells to the right rather than greatly shifting them to the right when a single programming pulse is applied. On the other hand, when the threshold voltage distribution of the plurality of non-volatile memory cells is slightly shifted to the right, the number of times the programming pulse is applied may increase. According to an embodiment, it may be three times or more than the number of bits of data that can be stored in the non-volatile memory cell. For example, when 2 bits of data can be stored in a non-volatile memory cell, the non-volatile memory cell may have four programmed states (e.g., '00', '01', '10', and '11') corresponding to 2-bit data. In order to form a tighter threshold voltage distribution (i.e., a narrower distribution), a degree to which the threshold voltage distribution of a plurality of non-volatile memory cells is shifted to the right, in response to a single programming pulse, can be smaller than a difference in two adjacent programmed states. For example, when two or more programming pulses are applied, it can be designed to move by a difference between two adjacent programmed states. In this case, the number of times of applying the programming pulse may be 8 times or more, which is more than 4 times than the number of bits of data.

Figure 6:
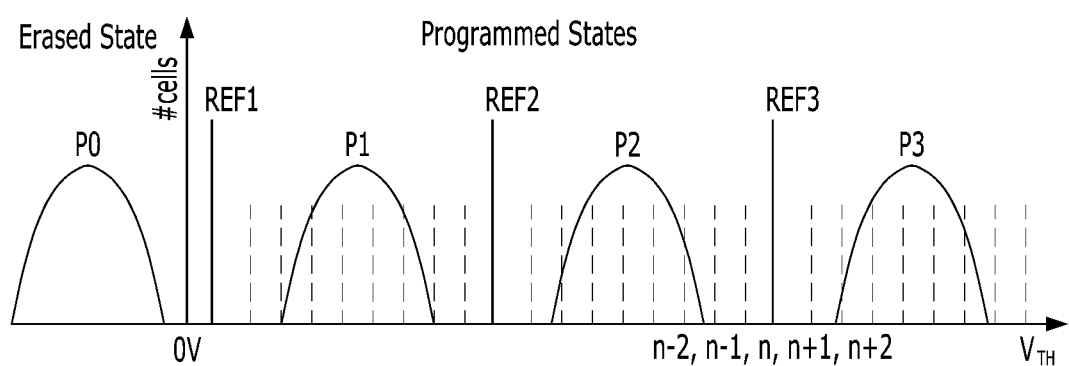
FIG. 6 illustrates target levels corresponding to plural program pulses according to an embodiment of the present disclosure.

According to an embodiment of the present disclosure, the degree to which the threshold voltage distribution of the plurality of non-volatile memory cells moves when a single programming pulse is applied may be understood as a target level. Referring to FIG. 6, the target level will be described in more detail.

Figure 4:
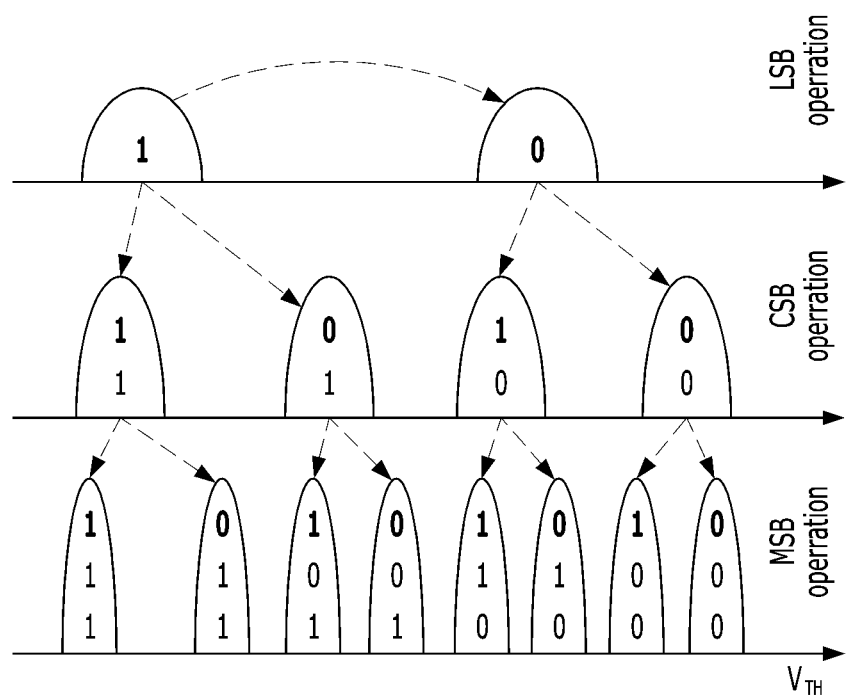
FIG. 4 illustrates a method for storing multi-bit data in a non-volatile memory cell according to an embodiment of the present disclosure.

FIG. 4 illustrates a method for storing multi-bit data in a non-volatile memory cell according to an embodiment of the present disclosure. FIG. 4 illustrates a program operation performed in the memory device 150 including non-volatile memory cells, each capable of storing 3-bit data.

Data stored in the non-volatile memory cell may be distinguishable based on a level of threshold voltage $V_{TH}$ of the corresponding memory cell. The threshold voltage $V_{TH}$ of the memory cell can vary depending on a quantity of electrons or charges injected into a floating gate of the corresponding memory cell. A single-level cell SLC may be divided into two ranges of the threshold voltage VTH, to store 1-bit data of "0" or "1". On the other hand, a triple-level cell TLC in the memory device 150 may have eight threshold voltage ranges.

Referring to FIG. 4, in order to reduce the number of applications of programming pulses in an incremental step pulse programming (ISPP) operation, the application of program pulses applied to the triple level cell TLC in response to bits of data stored in the triple level cell TLC can be controlled differently. Data stored in the triple-level cell TLC can be divided into LSB data, CSB data, and MSB data. In a process of programming the LSB data, the number of times of applying the programming pulses may be the smallest, and the number of times of applying the programming pulses in a process of programming the CSB data may be greater than that of programming the LSB data. In a process of programming the MSB data, the number of times of applying the programming pulses can be the largest.

In a memory device including a triple-level cell (TLC), each physical page may be divided into three logical pages that are an LSB page, a CSB page, and an MSB page. A programming pulse applied to each page can be different. That is, shifts of different positive threshold voltage (VTH) distributions may be induced in processes of programming the LSB, CSB, and MSB data. For example, the threshold voltages VTH of the plurality of non-volatile memory cells can move the most in the process of programming the LSB page, and the threshold voltages VTH of the plurality of non-volatile memory cells can move the least in a process of programming the MSB page. According to an embodiment, when the number of times a programming pulse is applied in the process of programming the LSB page is the least, delay time can be the shortest and power consumption can also be the smallest. On the other hand, in the process of programming the MSB page, the number of times that the programming pulse is applied may increase so that the delay time and the power consumption can be increased.

Figure 5:
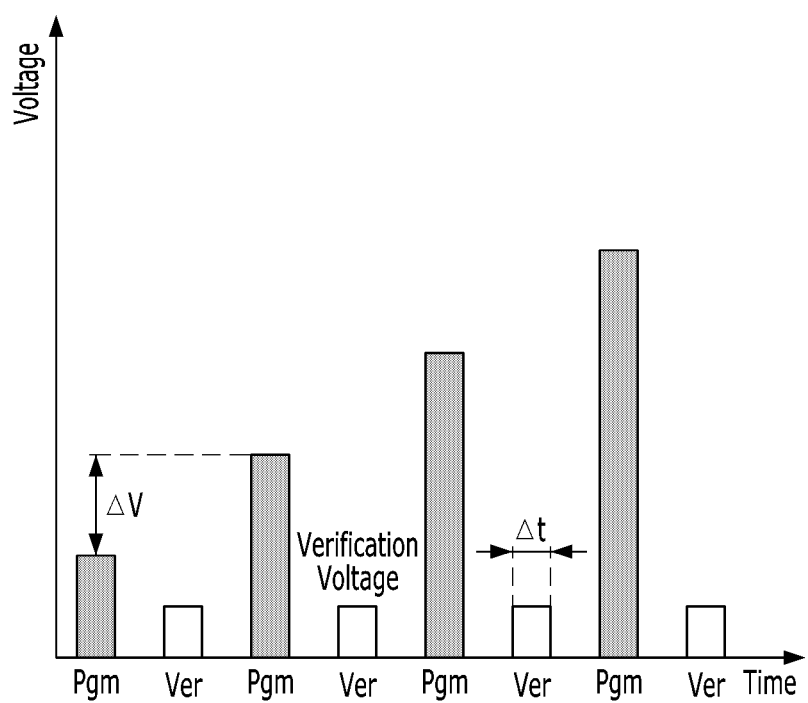
FIG. 5 illustrates a program operation and a verification operation of the ISPP operation according to an embodiment of the present disclosure.

FIG. 5 illustrates a program voltage application operation and a verification operation of the ISPP operation according to an embodiment of the present disclosure.

Referring to FIG. 5, after the program voltage application operation Pgm is performed during the ISPP operation, the memory device 150 performs a verification operation Ver corresponding to the program voltage application operation Pgm. Each program voltage application operation Pgm can increase the threshold voltage $V_{TH}$ of the non-volatile memory cell. For example, each program voltage application operation Pgm increases the threshold voltage $V_{TH}$ of the non-volatile memory cell by the first potential difference $\Delta V$. After the program voltage application operation Pgm is performed, the threshold voltage $V_{TH}$ of the non-volatile memory cell may be compared with a verification voltage in the verification operation. When the threshold voltage $V_{TH}$ of the non-volatile memory cell is lower than the verification voltage, the next program voltage application operation Pgm may be performed again to add more electrons into a floating gate of the non-volatile memory cell. Thereafter, the verification operation Ver is performed in response to the corresponding program voltage application operation Pgm. The repeated program voltage application operation Pgm may be performed until the threshold voltage $V_{TH}$ of the non-volatile memory cell reaches a target voltage (e.g., a verification voltage).

According to an embodiment, the number of repetitions of the program voltage application operation Pgm and the verification operation Ver may vary depending on a standby time or delay time, power consumption, accuracy, and the like. When the threshold voltage $V_{TH}$ of the non-volatile memory cell is finely increased through the program voltage application operation Pgm, accuracy of the program voltage application operation can be increased. However, delay time and power consumption can be longer and greater as a greater number of program voltage application operations can be performed. On the other hand, when the threshold voltage $V_{TH}$ of the non-volatile memory cell is greatly increased through each program voltage application operation Pgm, power consumption and operation time of the program voltage application operation Pgm may be increased and shorter. The operation times $\Delta t$ of the program voltage application operation Pgm and the verify operation Ver may vary according to a goal of each program voltage application operation Pgm (e.g., a change of the threshold voltage $V_{TH}$).

Referring to FIGS. 4 and 5, in a memory device including a triple-level non-volatile memory cell TLC, the program voltage application operation Pgm and the verify operation Ver may be differently performed based on purpose and procedure of programming data in the least significant bit LSB, the center significant bit CSB and the most significant bit MSB of the memory cell. In FIG. 4, a memory device including a triple level non-volatile memory cell TLC has been described as an example, but the above-described program operation can also be applied to a memory device including a quadruple level non-volatile memory cell (QLC) for storing 4-bit data or a non-volatile memory cell capable of storing 5 or more bit data.

According to an embodiment, for each program loop during the ISPP operation, a voltage level of the program pulse applied to the non-volatile memory cell in the program voltage application operation Pgm may be gradually increased by a preset voltage $\Delta V$. However, a voltage level of the verification pulse applied to the non-volatile memory cell in the verification operation Ver corresponding to the program voltage application operation Pgm may be substantially the same (i.e., not changed). In the verification operation Ver for each program loop, substantially the same verification pulse is applied to the non-volatile memory cell, but the time $\Delta t$ for applying the verification pulse may vary. Meanwhile, when the verification operation is performed by reflecting a noise generated according to operating characteristics of the memory device 150, the memory device 150 may change or adjust a voltage level of the verification pulse.

FIG. 6 illustrates target levels corresponding to plural program pulses according to an embodiment of the present disclosure. FIG. 6 shows a program state of a non-volatile memory cell storing 2-bit data and target levels according to program pulses.

Referring to FIG. 6, the non-volatile memory cell can have an erased state P0 and three programmed states P1 to P3. For example, the memory device 150 can apply a second reference voltage REF2 to the non-volatile memory cell to distinguish the erase state P0 and the first programmed state P1 from the second and third programmed states P2, P3. In the memory device 150, a first reference voltage REF1 can be used to distinguish the erased state P0 from the first programmed state P1. The memory device 150 may use a third reference voltage REF3 to distinguish the second and third programmed states P2, P3 from each other. For example, the erased state P0 can represent 2-bit data of '11', the first programmed state P1 can represent 2-bit data of '10', the second programmed states P2 can be represent 2-bit data of '00', and the third programmed state P3 can be represent 2-bit data of '01.' According to an embodiment, the number of bits of data that can be stored in the non-volatile memory cell may vary. Further, a quantity of reference voltages (or reference voltage levels) for discriminating multi-bit data may vary.

A plurality of program pulses may be applied in a process of programming the non-volatile memory cell from the erased state P0 to one of the first to third programmed states P1 to P3. When a program pulse is applied to a specific memory cell, a threshold voltage of the corresponding memory cell can be gradually increased. For example, in order to increase the threshold voltage of a specific non-volatile memory cell from the second programmed state P2 to the third programmed state P3, plural programming pulses may be applied in stages. For example, in FIG. 6, by applying eight programming pulses or applying a program pulse eight times, the threshold voltage distribution of the non-volatile memory cells can be gradually increased from the second programmed state P2 to the third programmed state P3. The larger the number of program pulses applied to a specific memory cell for increasing a preset level of threshold voltage, the narrower a width of threshold voltage distribution.

If the threshold voltage distribution of the non-volatile memory cells can be slightly shifted to the right by an applied programming pulse of the program voltage application operation, the verification operation can be performed in response to the program voltage application operation. For example, after applying an Nth programming pulse, the memory device 150 may perform a verification operation on an N target level corresponding to the Nth programming pulse. According to an embodiment, after the Nth programming pulse is applied, a verification operation is performed on plural target levels (e.g., N, N−1, N−2 target levels) which correspond to the Nth, (N−1)th, and (N−2)th programming pulses individually. If a verification operation is performed for several target levels after applying a single programming pulse, the memory device 150 may more accurately determine the threshold voltage distribution of the plurality of non-volatile memory cells. Based on the verification, the memory device 150 can narrow widths of threshold voltage distributions, each corresponding to one of the first to third programmed states P1 to P3. Further, the memory device 150 can more accurately determine a degree of wear or a result of operation.

When a plurality of programming pulses is applied while data is stored in a plurality of non-volatile memory cells included in the memory group 330, the control circuit 180 described with reference to FIG. 1 can include information about target levels verified in response to each programming pulse. In addition, according to a result of the verification operation performed in response to each programming pulse, the control circuit 180 may include information regarding which level or how long a next programming pulse applied to the plurality of non-volatile memory cells has or is. According to an embodiment, such information may be stored in a form of a look-up table.

Figure 7:
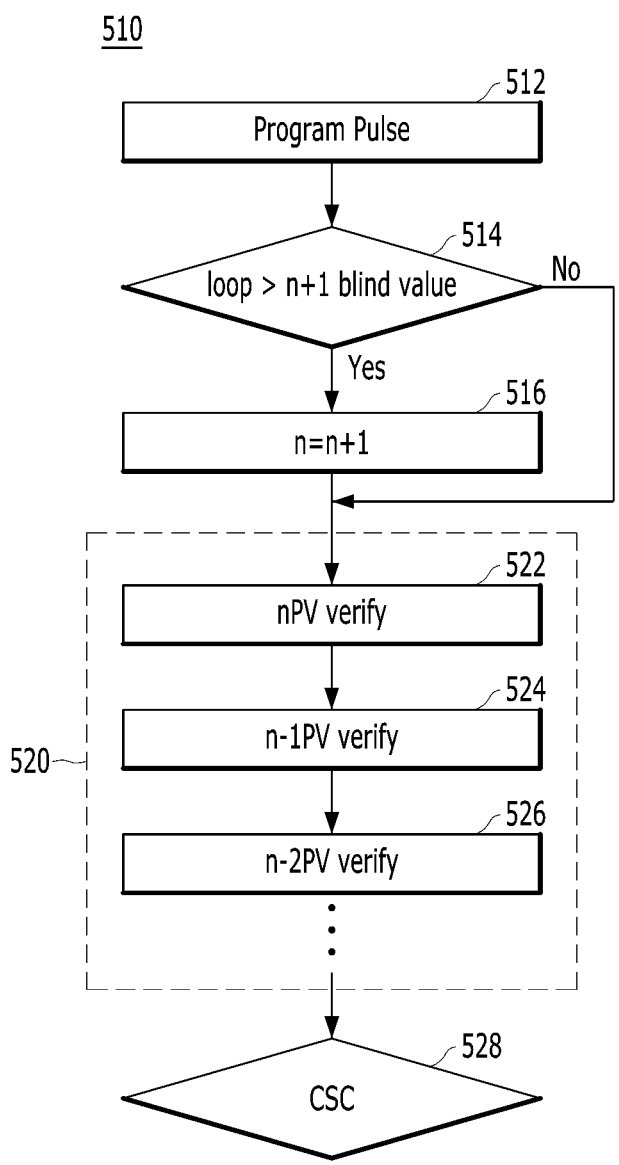
FIG. 7 illustrates a first example of a method for operating a memory device according to an embodiment of the present disclosure.

FIG. 7 illustrates a first example of a method for operating a memory device according to an embodiment of the present disclosure.

Referring to FIG. 7, the method for operating the memory device 510 can include applying a program pulse to a plurality of non-volatile memory cells (operation 512) and comparing the number of times (number of loops) of applying the program pulse with a maximum blind value (operation 514). As described with reference to FIG. 3, a program pulse may be applied several times to program data in the plurality of non-volatile memory cells.

Herein, a blind value may indicate at least one target level to which at least one program pulse is applied without a verification operation. The blind value can represent how many target levels the memory device 150 skips or omits the verification operation. The memory device 150 might not perform a verification operation regarding a target level when it is estimated that the target level is within a range in which an error might not occur in recognizing data in the threshold voltage distribution of the non-volatile memory cells. For example, referring to FIG. 6, when a target level is in a range higher than the median value in the distribution of the third programmed state P3, the memory device 150 might not have to perform a verification operation regarding the target level. The reference voltage for identifying the third program state P3 can be the third reference voltage REF3. In the distribution of the third programmed state P3, the target level higher than the median value is higher than the third reference voltage REF3, i.e., the target level is located right side of the third reference voltage. This operation of programming or erasing without a verification operation may be referred to as a blind method. According to an embodiment, if the maximum level that needs to be verified in response to a program pulse applied to the plurality of non-volatile memory cells is an N target level, an N+1 target level may be a blind value (i.e., the verification regarding the N+1 target level might not be performed).

Through the operation 514 of comparing the number of times (the number of loops) of applying the program pulse with a maximum blind value, the memory device 150 can avoid performing the program voltage application operation or the verification operation with an infinite loop for continuously increasing a target level of the verification operation. When the maximum target level in response to a programming pulse is reached (No in the operation 514), the memory device might not increase a target level any more for the verification operation. On the other hand, when the maximum target level corresponding to the programming pulse is not reached (Yes in the operation 514), the memory device 150 may increase the target level for the verification operation to the next level (operation 516).

When at least one target level in the verification operation is determined, the memory device 150 can perform the verification operation 520 (e.g., apply a verification voltage to a programmed memory cell). According to an embodiment, the verification operation 520 may be performed in response to a plurality of target levels. A current sensing circuit (CSC) may generate a check signal CS indicating whether at least some of the plurality of non-volatile memory cells have reached a target threshold voltage. According to the verification operation 520, the current sensing circuit CSC may selectively generate a check signal (operation 528).

According to an embodiment, the verification operation 520 can include performing a verification operation corresponding to an N target level (operation 522), performing a verification operation corresponding to an N−1 target level (operation 524), and performing a verification operation corresponding to an N−2 target level (operation 526). The verification operation 520 may be performed for checking a threshold voltage distribution of non-volatile memory cells based on various target levels which can be preset according to the number of bits of data stored in the non-volatile memory cell, a range in which a threshold voltage distribution moves in response to a single program pulse, and the like. When the verification operation 520 can be performed regarding plural target levels such as the N target level and levels lower than the N target level in the threshold voltage distributions corresponding to the first to third programmed states P1 to P3 described with reference to FIG. 6, the memory device can determine the next programming pulse to narrow widths of the threshold voltage distributions.

Figure 8:
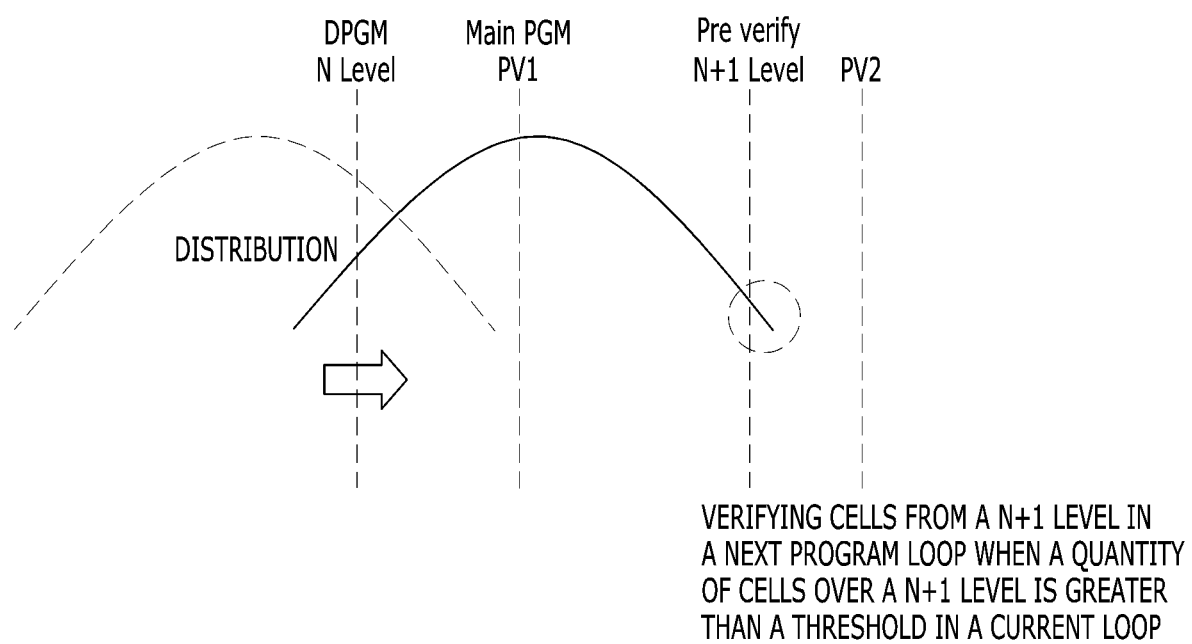
FIG. 8 illustrates a change of threshold voltage distribution in a program operation according to an embodiment of the present disclosure.

FIG. 8 illustrates a change of threshold voltage distribution in a program operation according to an embodiment of the present disclosure.

In FIG. 8, a verification operation performed after a programming pulse is applied to make the threshold voltage distribution shift to the right, is described. Plural programming pulses can be applied in order to reach the programmed states PV1, PV2 of the non-volatile memory cells.

In FIG. 8, a threshold voltage distribution before the programming pulse is applied can be indicated by a dotted line. When the programming pulse is applied to the plurality of non-volatile memory cells for the N target level (illustrated as "DPGM N Level" in FIG. 8), the threshold voltage distribution of the plurality of non-volatile memory cells may shift from a dotted line shape to a solid line shape to the right. In this case, if a program operation is performed for the plurality of non-volatile memory cells to have a first program value PV1, it may be understood that the plurality of non-volatile memory cells is sufficiently programmed based on the shifted threshold voltage distribution. In this case, the memory device 150 can perform a pre-verification regarding an N+1 target level (illustrated as "Pre verify N+1 Level" in FIG. 8) in response to the program voltage application operation for N target level. In the pre-verification regarding the N+1 level, the memory device 150 can recognize that at least one non-volatile memory cell is already programmed with the N+1 target level. In this case, in the verification operation performed after the next programming pulse is applied, the verification operation regarding levels from the N+1 target level can be performed. In a current program loop (i.e., Nth program loop), the memory device 150 can determine whether a quantity of non-volatile memory cells having a threshold voltage over the N+1 target level is greater than a threshold. In a next program loop (i.e., (N+1)th program loop), a verification can start from the N+1 target level. When the quantity of non-volatile memory cells in the current program loop is greater than a the threshold, the memory device 150 can skip or omit the verification operation regarding the N target level and the N−1 target level in the next program loop.

Threshold voltage distributions of the plurality of non-volatile memory cells may have symmetry with respect to a median value. Accordingly, if at least one non-volatile memory cell is sensed in a verification operation regarding a higher target level than a target level in a current program loop, the memory device 150 can estimate a rough threshold voltage distribution even if a verification regarding a lower target level than the target level is omitted or skipped in a next program loop.

Figure 9A:
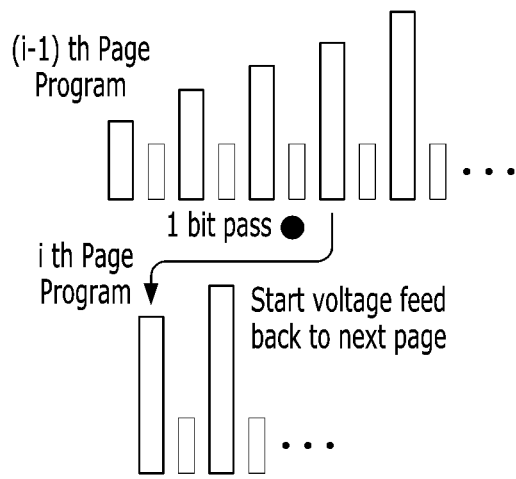
FIGS. 9A and 9B illustrate improved program and verification operations according to an embodiment of the present disclosure.
Figure 9B:
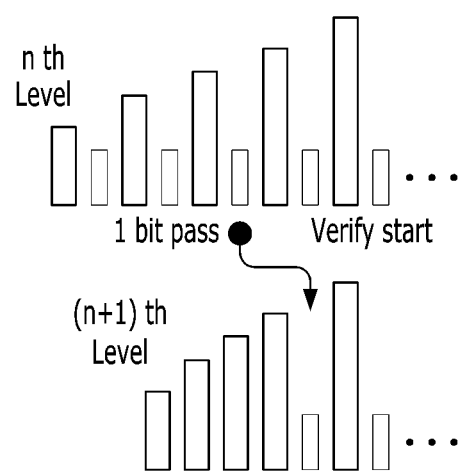

FIGS. 9A and 9B illustrate improved program and verification operations according to an embodiment of the present disclosure.

Specifically, FIGS. 9A and 9B show methods for improving a program operation speed of the memory device 150. In order to narrow the threshold voltage distribution of the plurality of non-volatile memory cells, it is advantageous that an incremental step of the Increasing Step Pulse Program (ISPP) is reduced. However, as the increment step of the ISPP is reduced, performance of the program operation performed in the memory device 150 might be lowered.

Referring to FIG. 9A, the memory device 150 may reduce the number of times a programming pulse is applied to a plurality of non-volatile memory cells during the ISPP. In the $(i-1)^{th}$ program loop, plural programming pulses may have been applied to a plurality of non-volatile memory cells coupled to a selected word line. Thereafter, when at least one non-volatile memory cell satisfying a specific target level is detected through a verification process (1 bit pass) corresponding to the $(i-1)^{th}$ program loop, the memory device 150 can determine that at least one programming pulse only for higher target level than the specific target level is applied to the non-volatile memory cells in a next i-th program loop. That is, application of the program pulse corresponding to a lower target level than the specific target level detected in the non-volatile memory cells might be omitted or skipped. Through this procedure, operation time and power spent on the ISPP could be reduced.

Referring to FIG. 9B, the memory device 150 may reduce a time spent on a verification operation corresponding to a program voltage application operation. After applying a plurality of programming pulses to the non-volatile memory cells, at least one non-volatile memory cell can be detected through a verification operation regarding an N target level (1 bit pass). A verification operation regarding an N+1 target level corresponding to the next program voltage application operation may be performed first. A verification operation regarding the N target level and a lower target level than the N target level can be omitted or skipped. Through this method, the memory device 150 can reduce the time spent on the verification operation performed after the program voltage application operation.

Figure 10:
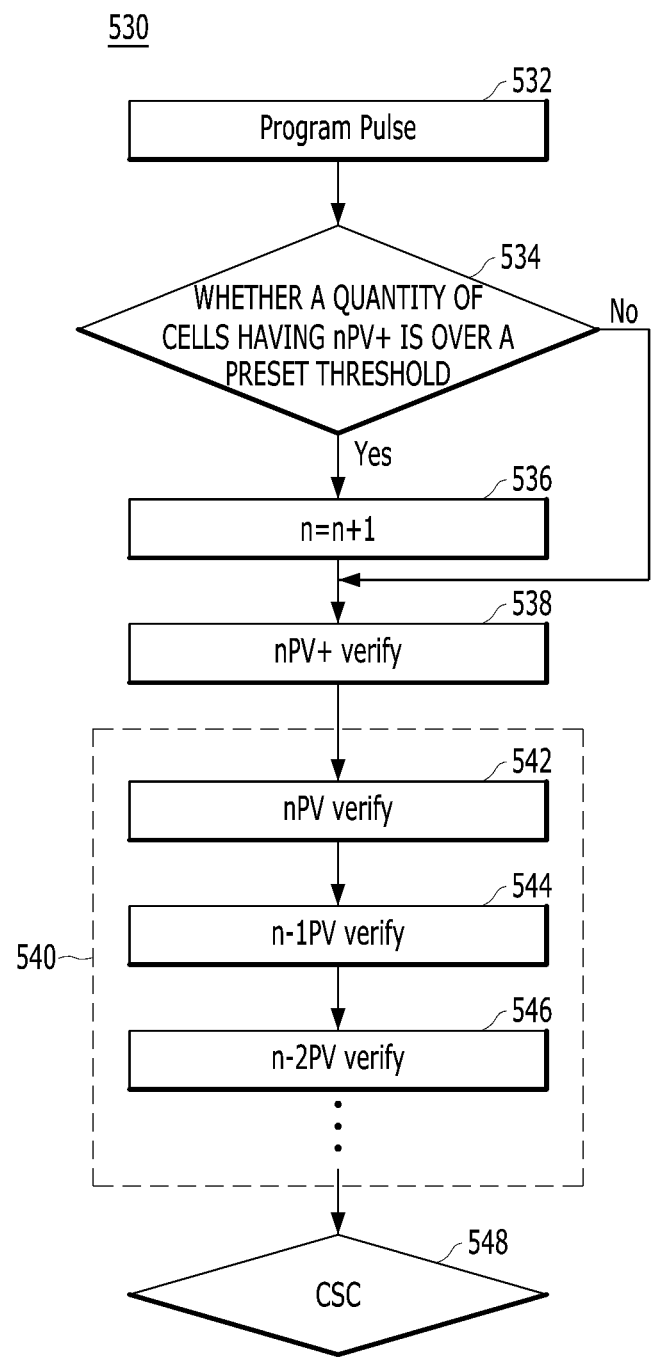
FIG. 10 illustrates a second example of a method for operating a memory device according to an embodiment of the present disclosure.

FIG. 10 illustrates a second example of a method for operating a memory device according to an embodiment of the present disclosure.

Referring to FIG. 10, a method for operating a memory device 530 can include applying a programming pulse to a plurality of non-volatile memory cells (operation 532) and performing a verification operation regarding a higher target level than a target level corresponding to the programming pulse to check whether a quantity of memory cells having threshold voltages greater than or equal to the higher target level is over a preset threshold (operation 534). According to an embodiment, the method 530 can be performed by the memory device 150 during a program loop.

When the memory device 150 determines that the quantity of non-volatile memory cells is greater than or equal to the preset threshold through the verification operation regarding the higher target level than the target level corresponding to the applied programming pulse (Yes in the operation 534), the target level for the verification operation corresponding to the current programming pulse can be increased (operation 536). When the quantity of non-volatile memory cells is less than the preset threshold through the verification operation regarding the higher target level than the target level corresponding to the applied programming pulse (No in the operation 534), the target level for the verification operation corresponding to the current programming pulse might not be increased.

The memory device 150 may perform a verification operation regarding the higher target level than the target level corresponding to the current programming pulse (operation 538). This verification result can be used to determine how to perform the verification operation corresponding to the programming pulse applied in the next program loop.

According to an embodiment, the memory device 150 may adjust the verification operation regarding preset target level(s) subject to the verification operation, (operation 540). For example, the verification operation for plural target levels nPV, n–1PV, n–2PV in the current program loop (operation 540) can be adjusted or skipped based on the quantity of memory cells which is checked during the verification operation. According to an embodiment, the verification operation 540 may include plural verification operations in response to a plurality of target levels. A current sensing circuit (CSC) may generate a check signal CS indicating whether at least some of the plurality of non-volatile memory cells have a threshold voltage which reached the target level. In response to the verify operation 540, the current sensing circuit CSC may selectively generate a check signal (operation 548).

According to an embodiment, the verification operation 540 may include performing a verification operation regarding an N target level (operation 542), performing a verification operation regarding an N–1 target level (operation 544), and performing a verification operation regarding an N–2 target level (operation 546). The verification operation 540 may be performed for various target levels determined according to the number of bits of data stored in the non-volatile memory cell, a range in which a threshold voltage distribution shifts or moves in response to a programming pulse, and the like. When the verification operation is performed for the N target level and the level lower than the N target level for achieving the threshold voltage distribution of the first to third programmed states P1 to P3 described with reference to FIG. 6, the memory device 150 can determine the next programming pulse to narrow widths of the threshold voltage distributions.

According to an embodiment, the memory device 150 can perform a verification operation regarding a higher target level than the target level corresponding to the applied programming pulse. For example, when the quantity of non-volatile memory cells is greater than or equal to the preset threshold in the verification operation regarding the higher target level than the target level corresponding to the applied programming pulse (Yes in the operation 534), a verification operation for at least some lower target levels in the verification operation 540 can be skipped or omitted. As described with reference to FIG. 9B, when the verification operation for at least some lower target levels is omitted or skipped, resources spent on the verification operation could be reduced.

Figure 11:
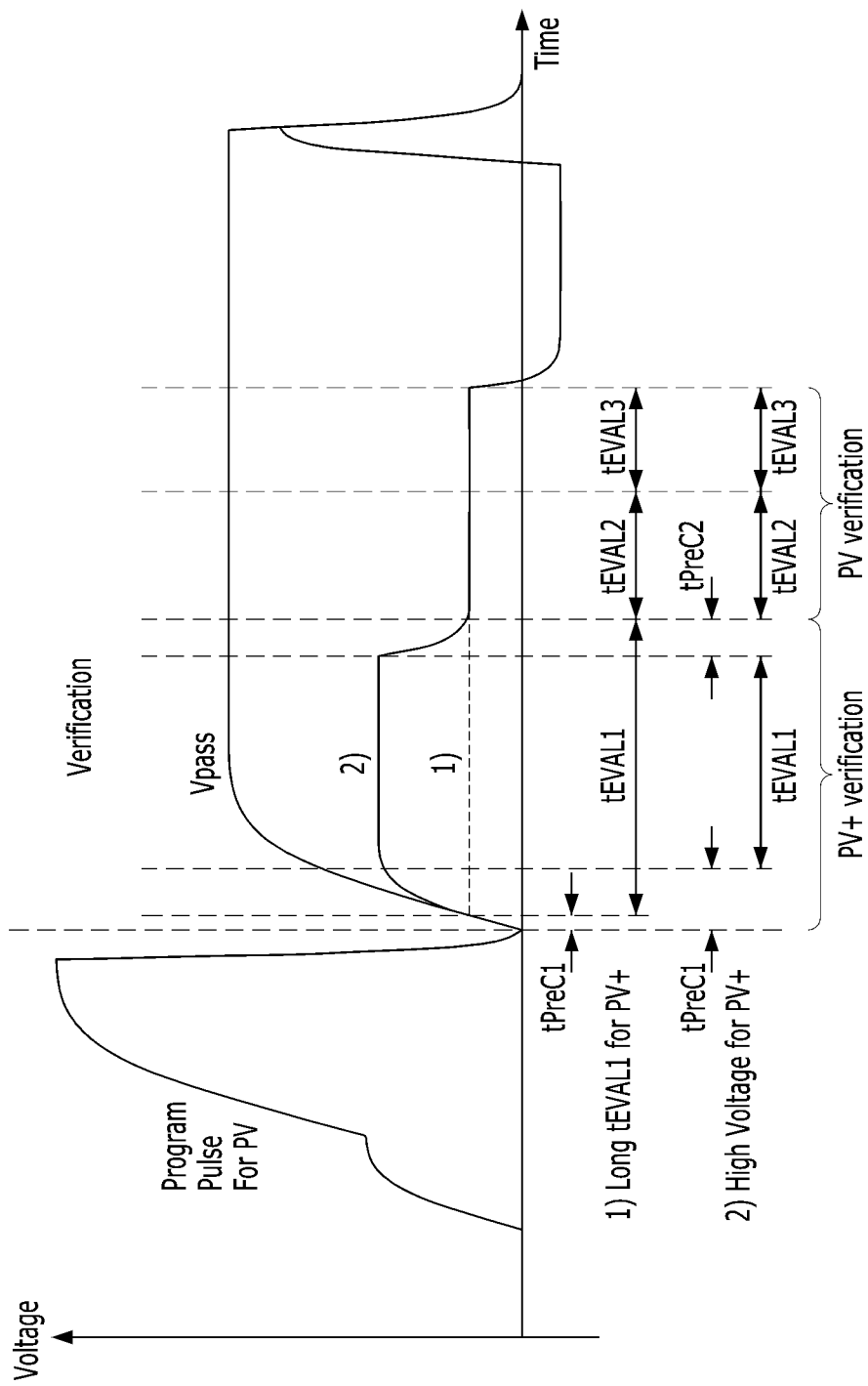
FIG. 11 illustrates a verification operation according to an embodiment of the present disclosure.

FIG. 11 illustrates a verification operation according to an embodiment of the present disclosure. Specifically, FIG. 11 describes the verification operation performed after a programming pulse is applied to non-volatile memory cells. The verification operation can include a verification operation regarding an N+1 target level which is higher than the N target level corresponding to the programming pulse used for programming the non-volatile memory cells with the N target level.

Referring to FIG. 11, the memory device 150 may apply a programming pulse for programming the non-volatile memory cells with a target level PV. After applying the programming pulse, a verification operation can be performed for plural target levels. The verification operation (Verification) can include a first verification operation (PV+ verification) regarding a higher target level PV+ than the target level PV corresponding to the programming pulse and a second verification operation (PV verification) regarding the target level PV.

According to an embodiment, a method for performing the first verification operation (PV+ verification) regarding the higher target level PV+(e.g., a target level of the next programming pulse), which is higher than the target level PV corresponding to the programming pulse, can be divided into two different methods. In a first method, a voltage level used for the second verification operation (PV verification) is also used for the first verification operation (PV+ verification), but a first verification time tEVAL1 of the first verification operation (PV+ verification) is longer than second or third verification time tEVAL2, tEVAL3 for the second verification operation (PV verification). Because the same level voltage can be applied to a selected word line in the first verification operation (PV+ verification) and the second verification operation (PV verification), a precharge operation may be performed only once before the first verification operation (PV+ verification). That is, after a single precharge operation tPreC1 is performed, both the first verification operation PV+ verification and the second verification operation PV verification can be performed.

A second method can include an operation of applying a voltage higher for the first verification operation (PV+ verification) than that of the second verification operation (PV verification). Because voltages having different levels are applied to the selected word line in the first verification operation (PV+ verification) and the second verification operation (PV verification), the first verification time tEVAL1 might not be longer than the second or third verification time tEVAL2, tEVAL3. However, because voltages having different levels are applied to the selected word line, a separate precharge operation should be further performed. That is, a first precharge operation tPreC1 may be performed before the first verification operation (PV+ verification), and a second precharge operation tPreC2 may be performed before the second verification operation (PV verification).

Through the two methods described above after the programming pulse is applied for the target level, a verification operation corresponding to the corresponding programming pulse may be performed regarding a plurality of target levels. In particular, the plurality of target levels may include a higher target level PV+(e.g., the target level corresponding to the next programming pulse) than the target level PV corresponding to the applied programming pulse.

Figure 12:
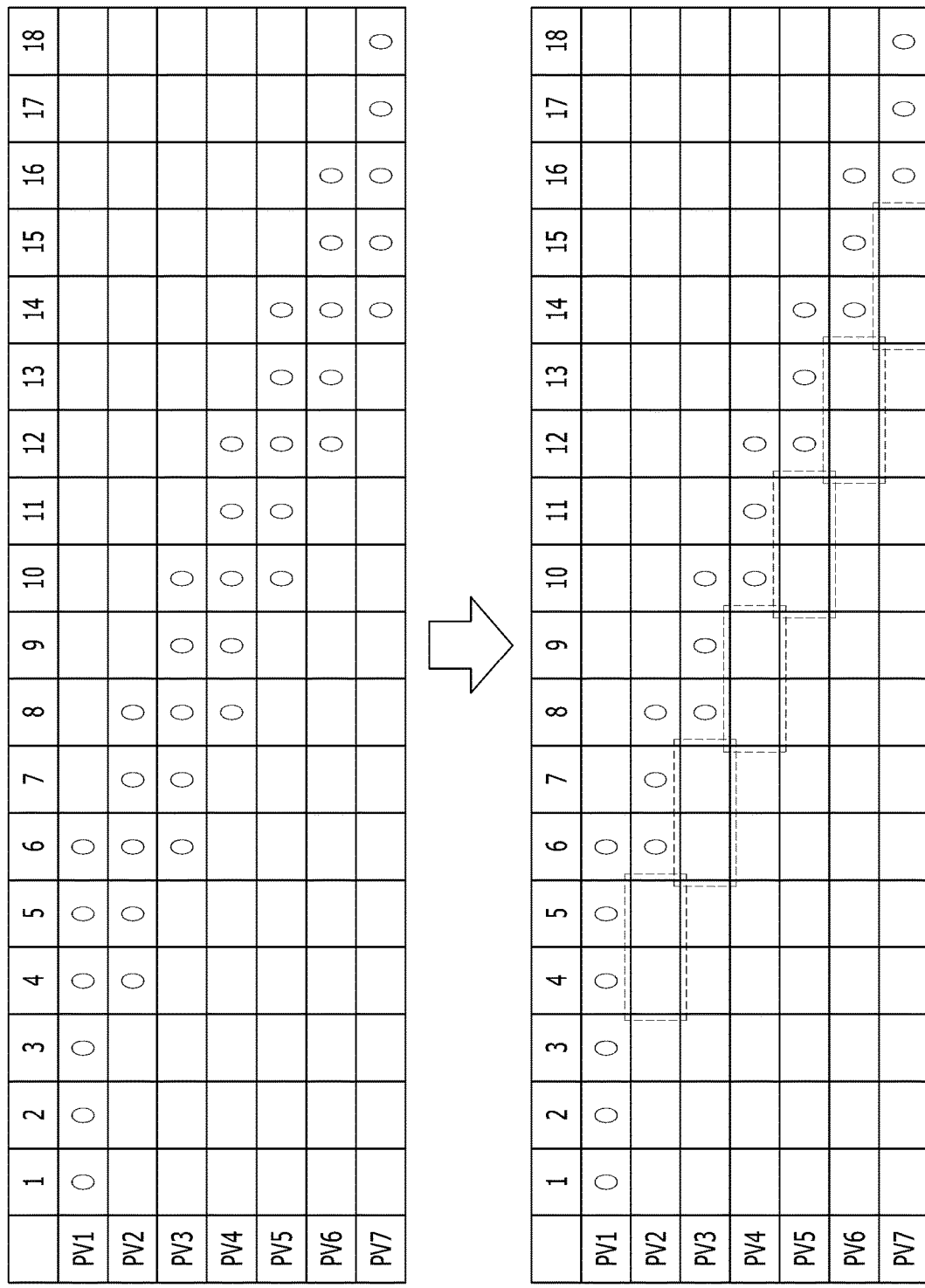
FIG. 12 illustrates improved performance obtained by a method for operating a memory device according to an embodiment of the present disclosure.

FIG. 12 illustrates improved performance obtained by a method for operating a memory device according to an embodiment of the present disclosure.

Referring to FIG. 12, a number of times that verification operations are performed can be reduced during a program operation, so that performance of the program operation is improved. Plural programming pulses PV1 to PV7 for the program voltage application operation and plural verification levels 1 to 18 for the verification operation described in FIG. 12 can be quantized as an example of understanding an embodiment of the invention. The plural programming pulses and the plural verification levels used within the memory device 150 can be changed or adjusted according to operational characteristics of the memory group 330.

Referring to a case (the upper table illustrated in FIG. 12) in which a verification operation is performed without a change during a program operation performed by the memory device 150, the verification operation corresponding to each of the first to seventh programming pulses PV1 to PV7 can be performed regarding five different target levels. For example, after the first programming pulse PV1 is applied, the verification operation may be performed regarding five target levels 5 to 1. During the verification operation corresponding to the first programming pulse PV1, the memory device 150 can determine that a quantity of memory cells having threshold voltages corresponding to higher target levels is less than a preset threshold. Accordingly, after the second programming pulse PV2 is applied, the verification operation may be performed regarding five target levels 7 to 3. During the verification operation corresponding to the second programming pulse PV2, the memory device 150 can determine that a quantity of memory cells having threshold voltages corresponding to higher target levels is less than a preset threshold. Then, after the third programming pulse PV3 is applied, the verification operation may be performed for five target levels 9 to 5. In this case, the verification is not adjusted.

As shown in the lower table illustrated in FIG. 12, in the memory device 150 according to an embodiment of the disclosure, when the first program pulse PV1 is applied, the verification operation can be performed regarding the next (or higher) target level 6 as well as the five target levels 5 to 1. In the verification operation regarding the next target level 6, at least one non-volatile memory cell may be detected or the memory device 150 can determine that a quantity of memory cells having threshold voltages corresponding to higher target levels is greater than or equal to a preset threshold. The memory device 150 can adjust target levels for the verification operation in the next program loop. Thereafter, after the second program pulse PV2 is applied, the verification operation may be performed only regarding a target level equal to or greater than the target level 6 in which a preset condition described above is satisfied. That is, the verification operation is omitted or skipped regarding a lower target level (e.g., levels 5, 4) than the target level 6. Accordingly, the verification operation regarding three target levels 8 to 6 can be performed with respect to the second programming pulse PV2. Here, the target level 8 can correspond to the third programming pulse PV3, and the target levels 7 and 6 can correspond to the second programming pulse PV2. For the verification operation performed regarding three target levels 8 to 6 in response to the second programming pulse PV2, the memory device 150 might perform the first verification operation PV+ verification and the second verification operation PV verification described in FIG. 11. When at least one non-volatile memory cell is detected or a quantity of memory cells having threshold voltages corresponding to higher target levels is greater than or equal to a preset threshold in the first verification operation (PV+ verification) corresponding to each programming pulse, the verification operation performed corresponding to each programming pulse may be continuously performed regarding only three target levels shown in FIG. 12. The number of verification operations (see the lower table) may be greatly reduced when compared to the case (see the upper table) in which verification operations are performed regarding a preset number of levels in response to each programming pulse. Through this procedure, program performance of the memory device 150 can be improved.

As above described, a memory device according to an embodiment of the present disclosure can improve data input/output speed.

In addition, according to an embodiment of the present disclosure, safety of a data item stored in the memory device can be improved and wear of the memory device can be reduced.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A memory device, comprising:
   a cell group including a plurality of non-volatile memory cells capable of storing data; and
   a control circuit configured to perform plural program loops for storing the data, each program loop including a program voltage application operation for the plurality of non-volatile memory cells and a verification operation corresponding to the program voltage application operation,
   wherein the control circuit is configured to, during a respective program loop, perform the verification operation for an N target level which is a current target level of the respective program loop among plural target levels corresponding to the data stored in each non-volatile memory cell, an N−1 target level lower than the N target level, and an N+1 higher than the N target level, in response to the program voltage application operation for the N target level, and
   wherein the control circuit is configured to, when a quantity of non-volatile memory cells having threshold voltages over the N+1 target level satisfies a preset criterion, skip a next verification operation for a target level lower than the N+1 target level, in response to a next program voltage application operation for the N+1 target level.

2. The memory device according to claim 1, wherein a quantity of target levels corresponding to the plural program loops is three times greater than a quantity of bits of the data to be stored in each of the plurality of non-volatile memory cells.

3. The memory device according to claim 1, wherein the control circuit is configured to perform the verification operation corresponding to the program voltage application operation by applying a first voltage to a selected word line for a first verification operation for the N+1 target level and apply a second voltage lower than the first voltage to the selected word line for second verification operations for the N−1 target level and the N target level.

4. The memory device according to claim 3, wherein the control circuit is configured to precharge bit lines coupled to the plurality of non-volatile memory cells before the first verification operation and the second verification operations.

5. The memory device according to claim 1,
wherein the control circuit is configured to perform the verification operation corresponding to the program voltage application operation by applying a first voltage to the selected word line for a first verification operation for the N+1 target level and a second verification operations for the N−1 target level or the N target level, and
wherein the control circuit is configured to perform the first verification operation longer than the second verification operation.

6. The memory device according to claim 5, wherein the control circuit is configured to precharge bit lines coupled to the plurality of non-volatile memory cells before the first verification operation.

7. The memory device according to claim 1, wherein the control circuit changes or adjusts the preset criterion based on a program/erase cycle of the plurality of non-volatile memory cells.

8. A memory system, comprising:
a controller configured to determine a location for storing program data and transfer a program command along with the program data; and
a memory device coupled to the controller via a data path and configured to receive the program command and the program data and output a success or failure regarding a program operation for the program data,
wherein the memory device comprises:
at least one memory block including a plurality of non-volatile memory cells capable of storing the program data; and
a control circuit configured to perform plural program loops for storing the program data in at least some non-volatile memory cells coupled to a selected word line in the at least one memory block, each program loop including a program voltage application operation and a verification operation corresponding to the program voltage application operation,
wherein the control circuit is configured to, during a respective program loop, perform the verification operation for an N target level which is a current target level of the respective program loop among plural target levels corresponding to the data stored in each non-volatile memory cell, an N−1 target level lower than the N target level, and an N+1 higher than the N target level, in response to the program voltage application operation for the N target level, and,
wherein the control circuit is configured to, when a quantity of non-volatile memory cells having threshold voltages over the N+1 target level satisfies a preset criterion, skip a next verification operation for a target level lower than the N+1 target level, in response to a next program voltage application operation for the N+1 target level.

9. The memory system according to claim 8, wherein the memory device comprises:
a buffer configured to temporarily store the program data to be stored in the location; and
a voltage supply circuit controlled by the control circuit to apply a first voltage to the selected word line and apply a second voltage having a different level from the first voltage to an unselected word line.

10. The memory system according to claim 8, wherein a quantity of target levels corresponding to the plural program loops is three times greater than a quantity of bits of the program data to be stored in each of the plurality of non-volatile memory cells.

11. The memory system according to claim 8, wherein the control circuit is configured to perform the verification operation corresponding to the program voltage application operation by applying a first voltage to the selected word line for a first verification operation for the N+1 target level and apply a second voltage lower than the first voltage to the selected word line for second verification operations for the N−1 target level and the N target level.

12. The memory system according to claim 11, wherein the control circuit is configured to precharge bit lines coupled to the at least some non-volatile memory cells before the first verification operation and the second verification operation.

13. The memory system according to claim 10,
wherein the control circuit is configured to perform the verification operation corresponding to the program voltage application operation by applying a first voltage to the selected word line for a first verification operation for the N+1 target level and a second verification operation for the N−1 target level or the N target level, and
wherein the control circuit is configured to perform the first verification operation longer than the second verification operation.

14. The memory system according to claim 13, wherein the control circuit is configured to precharge bit lines coupled to the at least some non-volatile memory cells before the first verification operation.

15. The memory system according to claim 8, wherein the control circuit changes or adjusts the preset criterion based on a program/erase cycle of the plurality of non-volatile memory cells.

16. A method for operating a memory device, comprising:
receiving program data, information regarding a location for storing the program data, and a program command;
selecting a word line corresponding to the information regarding the location; and
performing plural program loops for storing the program data in at least some non-volatile memory cells coupled to a selected word line, each program loop including a program voltage application operation and a verification operation corresponding to the program voltage application operation,
wherein the performing the plural program loops comprises, during a respective program loop:
performing the verification operations for an N target level which is a current target level of the respective program loop among plural target levels corresponding to the data stored in each non-volatile memory cell, an N−1 target level lower than the N target level, and an N+1 higher than the N target level, in response to the program voltage application operation for the N target level;
determining whether a quantity of non-volatile memory cells having threshold voltages over the N+1 target level satisfies a preset criterion; and
skipping a next verification operation for a target level lower than the N+1 target level, in response to the a next program voltage application operation for the N+1 target level, based on a result of the determining.

17. The method according to claim 16, wherein the performing the verification operation comprises:

applying a first voltage to the selected word line for a first verification operation for the N+1 target level; and applying a second voltage lower than the first voltage to the selected word line for second verification operations for the N−1 target level and the N target level.

18. The method according to claim 17, wherein the performing the verification operation further comprises:

precharging bit lines coupled to the at least some non-volatile memory cells before the first verification operation; and precharging the bit lines coupled to the at least some non-volatile memory cells before the second verification operations.

19. The method according to claim 16, wherein the performing the verification operation comprises:

applying a first voltage to the selected word line for a first verification operation for the N+1 target level and a second verification operations for the N−1 target level or the N target level, and wherein the first verification operation is carried out longer than the second verification operation.

20. The method according to claim 19, wherein the performing the verification operation comprises precharging bit lines coupled to the at least some non-volatile memory cells before the first verification operation.

* * * * *